(12) United States Patent
Ting et al.

(10) Patent No.: US 12,200,925 B2
(45) Date of Patent: Jan. 14, 2025

(54) CAPACITORS IN MEMORY DEVICES

(71) Applicant: Macronix International Co., Ltd., Hsinchu (TW)

(72) Inventors: Jung-Chuan Ting, Hsinchu (TW); Chih-Ting Hu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 410 days.

(21) Appl. No.: 17/723,965

(22) Filed: Apr. 19, 2022

(65) Prior Publication Data
US 2023/0337421 A1    Oct. 19, 2023

(51) Int. Cl.
*H10B 41/23* (2023.01)
*H10B 41/41* (2023.01)

(52) U.S. Cl.
CPC ............. *H10B 41/23* (2023.02); *H10B 41/41* (2023.02)

(58) Field of Classification Search
CPC ........ H10B 41/23; H10B 41/41; H10B 41/27; H10B 43/27; H10B 43/40; H01L 28/40; H01L 28/88; H01L 28/60; H01L 27/0676; H01L 27/11573; H01L 27/11582
See application file for complete search history.

(56) References Cited

U.S. PATENT DOCUMENTS

| | | | |
|---|---|---|---|
| 6,034,882 A | 3/2000 | Johnson et al. | |
| 6,063,688 A | 5/2000 | Doyle et al. | |
| 6,366,519 B1 | 4/2002 | Hung et al. | |
| 6,906,940 B1 | 6/2005 | Lue | |
| 6,933,224 B2 | 8/2005 | Nejad et al. | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,301,818 B2 | 11/2007 | Lu et al. | |
| 7,382,647 B1 | 6/2008 | Gopalakrishnan | |
| 7,495,294 B2 | 2/2009 | Higashitani | |
| 7,646,625 B2 | 1/2010 | Philipp et al. | |
| 7,742,338 B2 | 6/2010 | Santin et al. | |
| 7,851,849 B2 | 12/2010 | Kiyotoshi | |

(Continued)

FOREIGN PATENT DOCUMENTS

| | | |
|---|---|---|
| EP | 1936681 | 6/2008 |
| EP | 2048709 | 4/2009 |
| WO | WO 2004/025659 | 3/2004 |

*Primary Examiner* — Kyoung Lee
*Assistant Examiner* — Christina A Sylvia
(74) *Attorney, Agent, or Firm* — Fish & Richardson P.C.

(57) ABSTRACT

Methods, systems and apparatus for managing capacitors in memory devices, e.g., three-dimensional (3D) memory devices are provided. In one aspect, a capacitor includes: a first terminal, a second terminal conductively insulated from the first terminal, and a capacitance structure that includes a plurality of layers sequentially stacked together. At least one layer includes: one or more first conductive parts and one or more second conductive parts that are conductively insulated in the layer, the one or more first conductive parts being conductively coupled to the first terminal, the one or more second conductive parts being conductively coupled to the second terminal. The at least one layer is configured such that at least one of the one or more second conductive parts forms at least one subordinate capacitor with at least one adjacent first conductive part.

20 Claims, 13 Drawing Sheets

(56) References Cited

U.S. PATENT DOCUMENTS

| | | |
|---|---|---|
| 7,902,035 B2 | 3/2011 | Yu et al. |
| 7,915,667 B2 | 3/2011 | Knoefler et al. |
| 8,154,128 B2 | 4/2012 | Lung |
| 8,208,279 B2 | 6/2012 | Lue |
| 8,383,512 B2 | 2/2013 | Chen et al. |
| 8,488,387 B2 | 7/2013 | Lue et al. |
| 8,598,032 B2 | 12/2013 | Chen et al. |
| 8,743,611 B2 | 6/2014 | Hioka |
| 8,824,212 B2 | 9/2014 | Lue |
| 8,891,293 B2 | 11/2014 | Du et al. |
| 8,933,502 B2 | 1/2015 | Higashitani et al. |
| 8,941,166 B2 | 1/2015 | Chen et al. |
| 9,048,341 B2 | 6/2015 | Chen et al. |
| 9,070,434 B2 | 6/2015 | Hioka et al. |
| 9,190,499 B2 | 11/2015 | Hirai et al. |
| 9,336,878 B2 | 5/2016 | Khwa et al. |
| 9,716,137 B1 | 7/2017 | Hu et al. |
| 2003/0025147 A1 | 2/2003 | Nomoto et al. |
| 2005/0280061 A1 | 12/2005 | Lee |
| 2007/0215874 A1 | 9/2007 | Furukawa et al. |
| 2008/0006869 A1 | 1/2008 | Kamigaichi et al. |
| 2008/0073635 A1* | 3/2008 | Kiyotoshi .............. H10B 63/00 257/E21.409 |
| 2008/0101109 A1 | 5/2008 | Haring-Bolivar et al. |
| 2009/0045445 A1 | 2/2009 | Yang et al. |
| 2009/0097321 A1 | 4/2009 | Kim et al. |
| 2009/0109737 A1 | 4/2009 | Kostylev |
| 2009/0184360 A1 | 7/2009 | Jin et al. |
| 2009/0230449 A1 | 9/2009 | Sakaguchi et al. |
| 2009/0261479 A1 | 10/2009 | Hong |
| 2010/0244269 A1 | 9/2010 | Kim |
| 2010/0270593 A1 | 10/2010 | Lung et al. |
| 2011/0051507 A1 | 3/2011 | Sarkar et al. |
| 2011/0080781 A1 | 4/2011 | Goux |
| 2011/0084397 A1 | 4/2011 | Lung |
| 2011/0140070 A1 | 6/2011 | Kim |
| 2011/0235403 A1 | 9/2011 | Kang |
| 2012/0182807 A1 | 7/2012 | Lue |
| 2012/0327708 A1 | 12/2012 | Du et al. |
| 2013/0051126 A1 | 2/2013 | Kwong |
| 2013/0113033 A1 | 5/2013 | Choi et al. |
| 2013/0126957 A1 | 5/2013 | Higashitani et al. |
| 2013/0130468 A1 | 5/2013 | Higashitani et al. |
| 2014/0198582 A1 | 7/2014 | Freeman |
| 2014/0226388 A1 | 8/2014 | Khoueir et al. |
| 2015/0318296 A1 | 11/2015 | Kim et al. |
| 2017/0053932 A1 | 2/2017 | Jeon |
| 2017/0141026 A1* | 5/2017 | Tu .......................... H10B 63/30 |
| 2020/0279908 A1* | 9/2020 | Siprak ................. H01L 23/5227 |
| 2020/0321349 A1* | 10/2020 | Kwon .................... H10B 43/40 |
| 2023/0187479 A1* | 6/2023 | Tu ........................ H01L 27/0688 257/532 |

\* cited by examiner

CAPACITORS IN MEMORY DEVICES

BACKGROUND

As critical dimensions of devices in integrated circuits shrink to the limits of common memory cell technologies, various three-dimensional (3D) structures have been developed by stacking multiple levels of memory cells to achieve greater storage capacity and lower costs per bit. Capacitors can be used to help reduce voltage variations and to help save data in memory devices, either during normal operations or due to unexpected power failures. In program or erase operations, charge pumps are used to boost lower input voltages to higher bias voltages to be applied to word lines/bit lines, which requires capacitors in the charge pumps to have high capacitances. Moreover, as the number of word line layers in the 3D structures increases, the capacitances for the charge pumps also increase. However, conventional capacitors providing large capacitances take a large area footprint, which in turn affects the scalability of the memory devices. Thus, it is desirable to provide capacitors having stable yet large capacitances, but having reduced areas without increasing manufacturing cost.

SUMMARY

The present disclosure describes methods, systems, and techniques for managing capacitors in memory devices, e.g., 3D memory devices.

One aspect of the present disclosure features a device including: a first terminal, a second terminal conductively insulated from the first terminal, and a capacitance structure including a plurality of layers sequentially stacked together. At least one layer of the plurality of layers includes: one or more first conductive parts and one or more second conductive parts that are conductively insulated, the one or more first conductive parts being conductively coupled to the first terminal, the one or more second conductive parts being conductively coupled to the second terminal. The at least one layer is configured such that at least one of the one or more second conductive parts forms at least one subordinate capacitor with at least one adjacent first conductive part.

In some embodiments, the plurality of layers includes multiple conductive layers. Adjacent first and second conductive layers are insulated by a corresponding insulation layer therebetween, and first conductive parts of the first and second conductive layers are conductively coupled through one or more first conductive vias in the corresponding insulation layer to the first terminal, and second conductive parts of the first and second conductive layers are conductively coupled through one or more second conductive vias in the corresponding insulation layer to the second terminal.

In some embodiments, the one or more first conductive vias and the one or more second conductive vias in the corresponding insulation layer are conductively insulated, and the corresponding insulation layer is configured such that at least one second conductive via forms at least one additional subordinate capacitor with at least one adjacent first conductive via in the corresponding insulation layer.

In some embodiments, each of the one or more second conductive vias forms at least one subordinate capacitor with at least one adjacent first conductive via in the corresponding insulation layer.

In some embodiments, a layout of the one or more first conductive vias and the one or more second conductive vias in the corresponding insulation layer is substantially same as a layout of one or more first conductive parts and one or more second conductive parts in at least one of the first and second conductive layers.

In some embodiments, at least one first conductive via or at least one second conductive via in the corresponding insulation layer includes a conductive stripe, and at least one of two or more first conductive vias or two or more second conductive vias in the corresponding insulation layer are conductively coupled to form one or more trenches.

In some embodiments, at least one of the one or more first conductive vias or the one or more second conductive vias form an integrated structure.

In some embodiments, first conductive parts in one of the first and second conductive layers are physically connected together to form a first integrated structure, and second conductive parts in the other one of the first and second conductive layers are physically connected together to form a second integrated structure.

In some embodiments, at least one second conductive part is separated from another second conductive part in the one of the first and second conductive layers, and at least one first conductive part is separated from another first conductive part in the other one of the first and second conductive layers.

In some embodiments, at least one of the one or more first conductive vias or the one or more second conductive vias include individual conductive pillars that are insulated from each other, and two or more first conductive vias and two or more second conductive vias are configured to form a corresponding subordinate capacitor.

In some embodiments, at least one of the two or more first conductive vias or the two or more second conductive vias are arranged according to a stripe shape or a trench shape.

In some embodiments, at least one of the one or more first conductive parts or the one or more second conductive parts forms an integrated structure.

In some embodiments, the capacitance structure further includes a top layer arranged on the plurality of layers, the top layer including a plurality of first conductive parts conductively coupled to the first terminal, and at least one second conductive part in an adjacent conductive layer under the top layer forms at least one additional subordinate capacitor with one or more first conductive parts in the top layer.

In some embodiments, the capacitance structure includes an insulation layer between the top layer and the adjacent conductive layer, and the insulation layer includes one or more conductive vias configured to conductively couple the plurality of first conductive parts in the top layer to one or more corresponding first conductive parts in the adjacent conductive layer.

In some embodiments, the top layer includes no second conductive part, and the first conductive parts in the top layer are conductively insulated from each other, and the one or more conductive vias in the insulation layer are distributed as individual conductive contacts.

In some embodiments, the device further includes a transistor including a gate, a source, and a drain. The first terminal is conductively coupled to the source and the drain of the transistor through one or more first conductive contacts, and the second terminal is conductively coupled to the gate of the transistor through one or more second conductive contacts.

Another aspect of the present disclosure features a device including: an input node configured to receive an input voltage; an output node configured to output an output voltage; and a plurality of units conductively coupled in series between the input node and the output node and configured to generate the output voltage based on the input voltage. Each of the units includes: a diode and a capacitor having a first node coupled between the diode and a sequential unit immediately after the unit and a second node configured to receive a clock signal, the diode being configured to control the capacitor using the clock signal. The capacitor includes: a first terminal, a second terminal conductively insulated from the first terminal, and a capacitance structure including a plurality of layers sequentially stacked together. At least one layer of the plurality of layers includes: one or more first conductive parts and one or more second conductive parts that are conductively insulated, the one or more first conductive parts being conductively coupled to the first terminal, the one or more second conductive parts being conductively coupled to the second terminal, where the at least one layer is configured such that at least one of the one or more second conductive parts forms at least one subordinate capacitor with at least one adjacent first conductive part in the layer.

In some embodiments, the plurality of layers includes multiple conductive layers. Adjacent conductive layers are insulated by a corresponding insulation layer therebetween, and first conductive parts in the adjacent conductive layers are conductively coupled through one or more first conductive vias in the corresponding insulation layer to the first terminal, and second conductive parts in the adjacent conductive layers are conductively coupled through one or more second conductive vias in the corresponding insulation layer to the second terminal. The one or more first conductive vias and the one or more second conductive vias in the corresponding insulation layer are conductively insulated, and where the corresponding insulation layer is configured such that at least one second conductive via forms at least one additional subordinate capacitor with at least one adjacent first conductive via in the corresponding insulation layer.

A further aspect of the present disclosure features a memory device including: a semiconductor substrate; a memory cell array of memory cells on the semiconductor substrate; and at least one capacitor including: a first terminal; a second terminal arranged insulated from the first terminal; and a capacitance structure including a plurality of layers sequentially stacked together above the semiconductor substrate. At least one layer of the plurality of layers includes: one or more first conductive parts and one or more second conductive parts that are conductively insulated, the one or more first conductive parts being conductively coupled to the first terminal, the one or more second conductive parts being conductively coupled to the second terminal. The at least one layer is configured such that each of the one or more second conductive parts forms at least one subordinate capacitor with at least one adjacent first conductive part.

In some embodiments, the plurality of layers includes multiple conductive layers, where adjacent conductive layers are insulated by a corresponding insulation layer therebetween, and where first conductive parts in the adjacent conductive layers are conductively coupled through one or more first conductive vias in the corresponding insulation layer to the first terminal, and second conductive parts in the adjacent conductive layers are conductively coupled through one or more second conductive vias in the corresponding insulation layer to the second terminal. The one or more first conductive vias and the one or more second conductive vias in the corresponding insulation layer are conductively insulated, and where the corresponding insulation layer is configured such that at least one second conductive via forms at least one additional subordinate capacitor with at least one adjacent first conductive via in the corresponding insulation layer.

In some embodiments, first conductive parts in one of the adjacent conductive layers are physically connected together to form a first integrated structure, and second conductive parts in another one of the adjacent conductive layers are physically connected together to form a second integrated structure.

In some embodiments, the memory device further includes: a transistor including a gate, a source, and a drain. The first terminal of the at least one capacitor is conductively coupled to the source and the drain through one or more first conductive contacts, and the second terminal of the at least one capacitor is conductively coupled to the gate of the transistor through one or more second conductive contacts.

In some embodiments, the transistor is formed on the semiconductor substrate, two doped regions are formed in the semiconductor substrate and configured to be the source and the drain of the transistor, respectively, and the gate of the transistor includes a metal plate conductively insulated from the two doped regions in the semiconductor substrate.

In some embodiments, the at least one capacitor is peripheral to the memory cell array, and the at least one capacitor is arranged above the memory cell array, and the first conductive contacts and the second conductive contacts are through-array contacts.

In some embodiments, the at least one capacitor is integrated in a circuit layer under the memory cell array.

The techniques can be implemented for any type of circuits (e.g., capacitors) or devices (e.g., charge pumps) that need large capacitances with small areas. The circuits or devices can use conductive vias (or electrical connections between conductive layers) that are close to each other as capacitors to increase capacitances. In particular, trench-type conductive vias are regarded as closely arranged electrode plates. In some examples, the techniques can increase the capacitance of a capacitor by twice under the same area. On the contrary, the techniques can reduce the capacitor area of a capacitor with the same capacitance by 50%.

The techniques implemented in the present disclosure can be applied to various memory types, such as SLC (single-level cell) devices, MLC (multi-level cell) devices like 2-level cell devices, TLC (triple-level cell) devices, or QLC (quad-level cell) devices. The techniques can be applied to various dimensions of memory devices or systems, such as two-dimensional (2D) or three-dimensional (3D) memory devices or systems. The techniques can be applied to various types of non-volatile memory devices or systems, such as Mask Read-Only Memory, Programmable Read-Only Memory, Erasable Programmable Read-Only Memory, Electrically Erasable Programmable Read-Only Memory, and Flash Memory. The 3D memory devices or systems can include 3D-NAND memory devices, 3D-NOR memory devices, 3D-AND memory devices, among others. Additionally or alternatively, the techniques can be applied to various types of devices and systems, such as secure digital (SD) cards, embedded multimedia cards (eMMC), or solid-state drives (SSDs), embedded systems, media players, mobile devices, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1A:
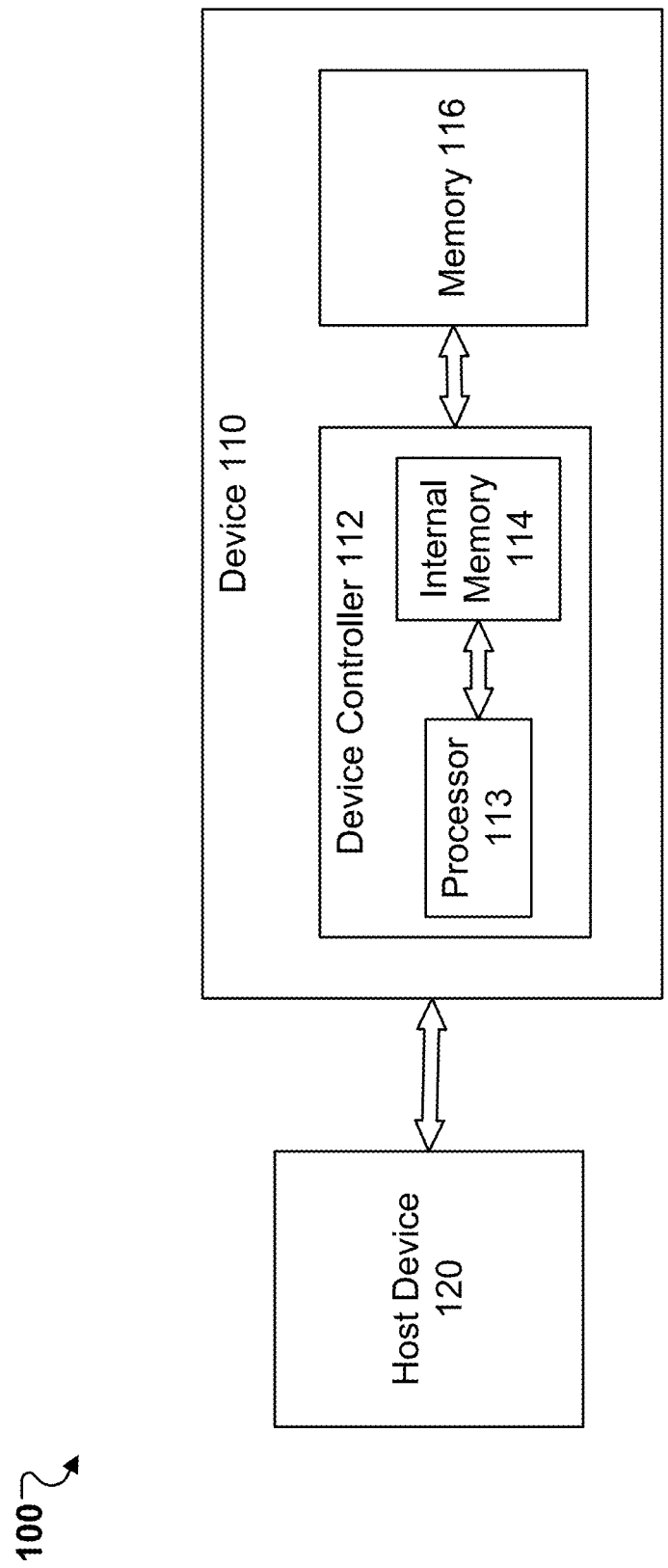
FIG. 1A is a schematic diagram of an example of a system including a memory device.

FIG. 1A illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

The memory 116 includes a plurality of blocks. The memory 116 can be a two-dimensional (2D) memory including 2D memory blocks. The memory 116 can also be a three-dimensional (3D) memory including 3D memory blocks.

Figure 1B:
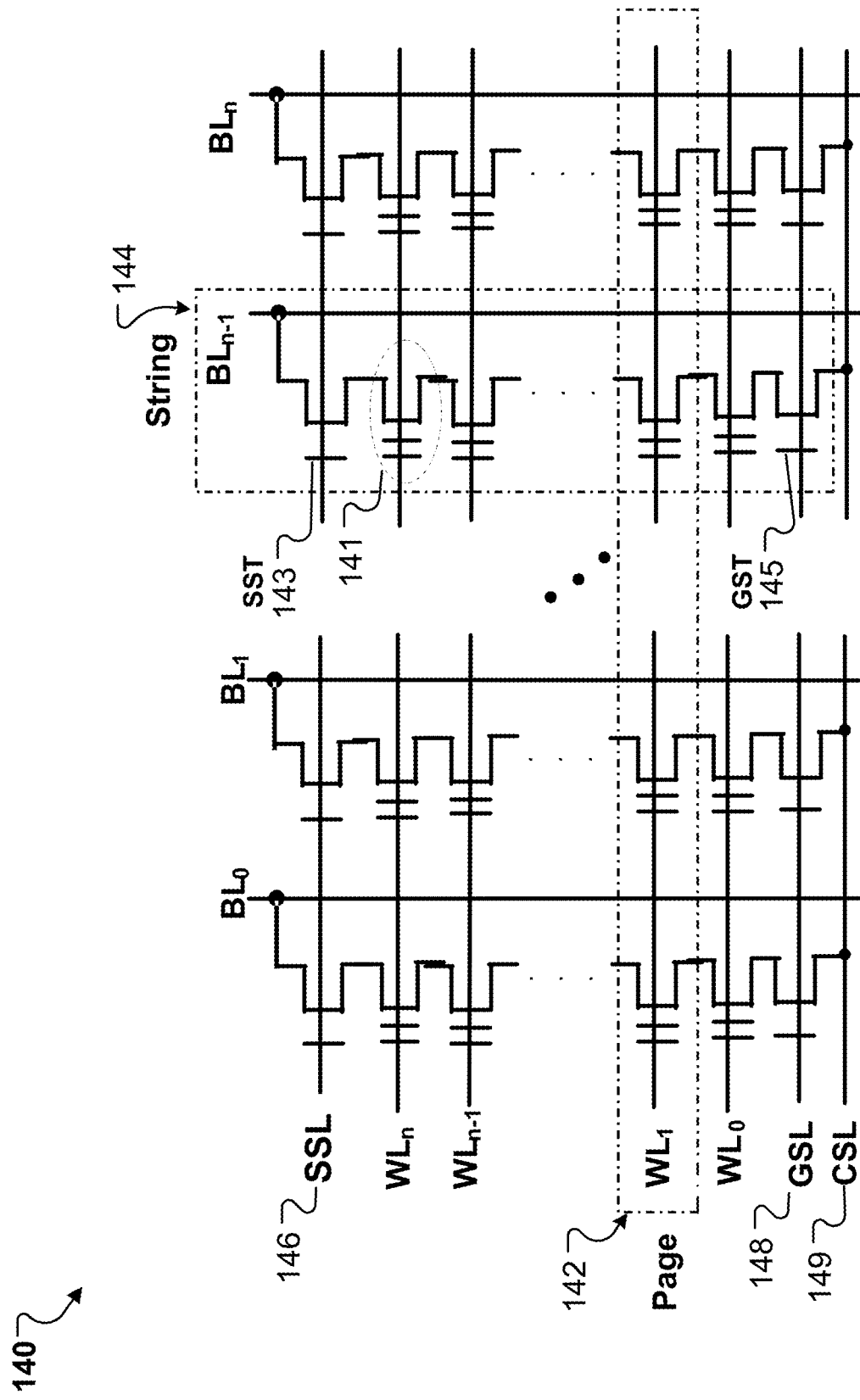
FIG. 1B is a schematic diagram of an example block of a two-dimensional (2D) memory.

FIG. 1B illustrates an example configuration of a 2D memory block 140 when the memory 116 is a 2D memory. The block 140 includes memory cells 141 coupled in series to column bit lines $BL_0$, $BL_1$, ..., $BL_{n-1}$, and $BL_n$ to form a number of cell strings 144, and to row word lines $WL_0$, $WL_1$, ..., $WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs 143 in different strings are also connected to the same SSL. Gates of the memory cells 141 are respectively connected to word lines $WL_0$, $WL_1$, ..., $WL_{n-1}$, $WL_n$. The cell strings 144 or the memory cells 141 are connected to a common source line (CSL) 149 via the GST 145. The CSL 149 can be coupled to a ground. A gate of the GST 145 is connected to a ground select line (GSL) 148. Gates of the GSTs 145 in different strings 144 are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower voltage is applied onto a word line corresponding to the particular cell page 142. Meanwhile, a higher voltage is applied onto the other cell pages in the block 140.

Figure 1C:
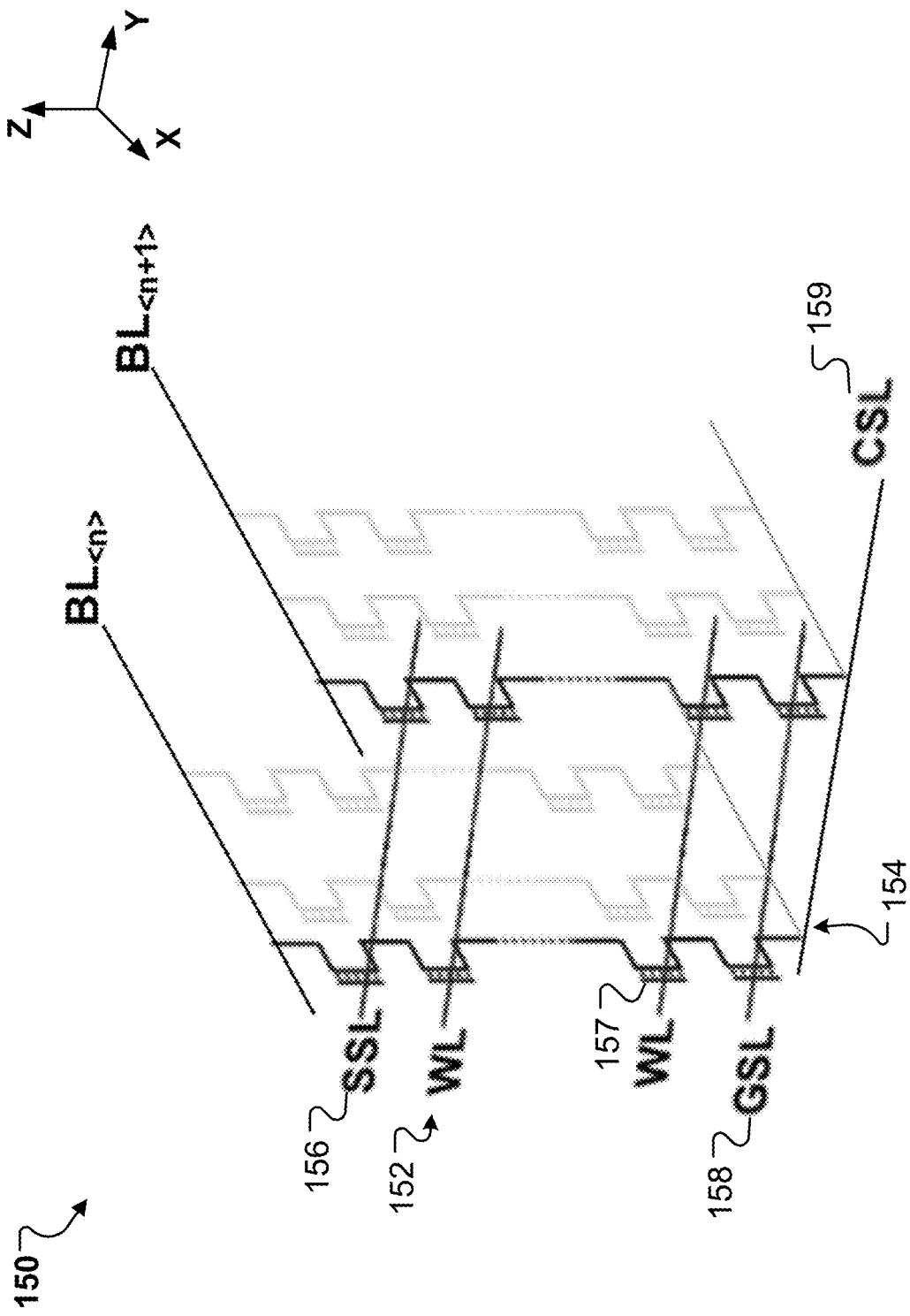
FIG. 1C is a schematic diagram of an example block of a three-dimensional (3D) memory.

FIG. 1C illustrates an example 3D memory block 150 when the memory 116 (shown in FIG. 1A) is a 3D memory. The 3D memory block 150 can be a stack of the 2D memory block 140 of FIG. 1B. Memory cells 157 are arranged in three dimensions, e.g., in an XYZ coordinate system, and coupled to a number of word lines to form a number of cell pages (conductive layers or word line layers) 152 and a number of bit lines to form a number of cell strings 154. A cell page 152 can be a layer, e.g., in the XY plane, and memory cells 157 on the same layer can be coupled to one word line and have a same voltage. Each cell page 152 can be connected to a respective contact pad in a driving circuit, e.g., X-decoder (or a scanning driver).

A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 are connected to one or more drivers, e.g., data drivers. The cell strings 154 of the memory cells 157 are connected to a common source line (CSL) 159 via the ground select transistors (GSTs). The SSL 156 can be a conductive line or layer formed on top of cell pages (or word line layers) 152. The memory block 150 can include multiple SSLs 156 on top of the cell pages 152. The CSL 159 can be a conductive layer (or multiple conductive lines) formed on a substrate of the 3D memory. The CSL 159 can be coupled to the ground.

Figure 2:
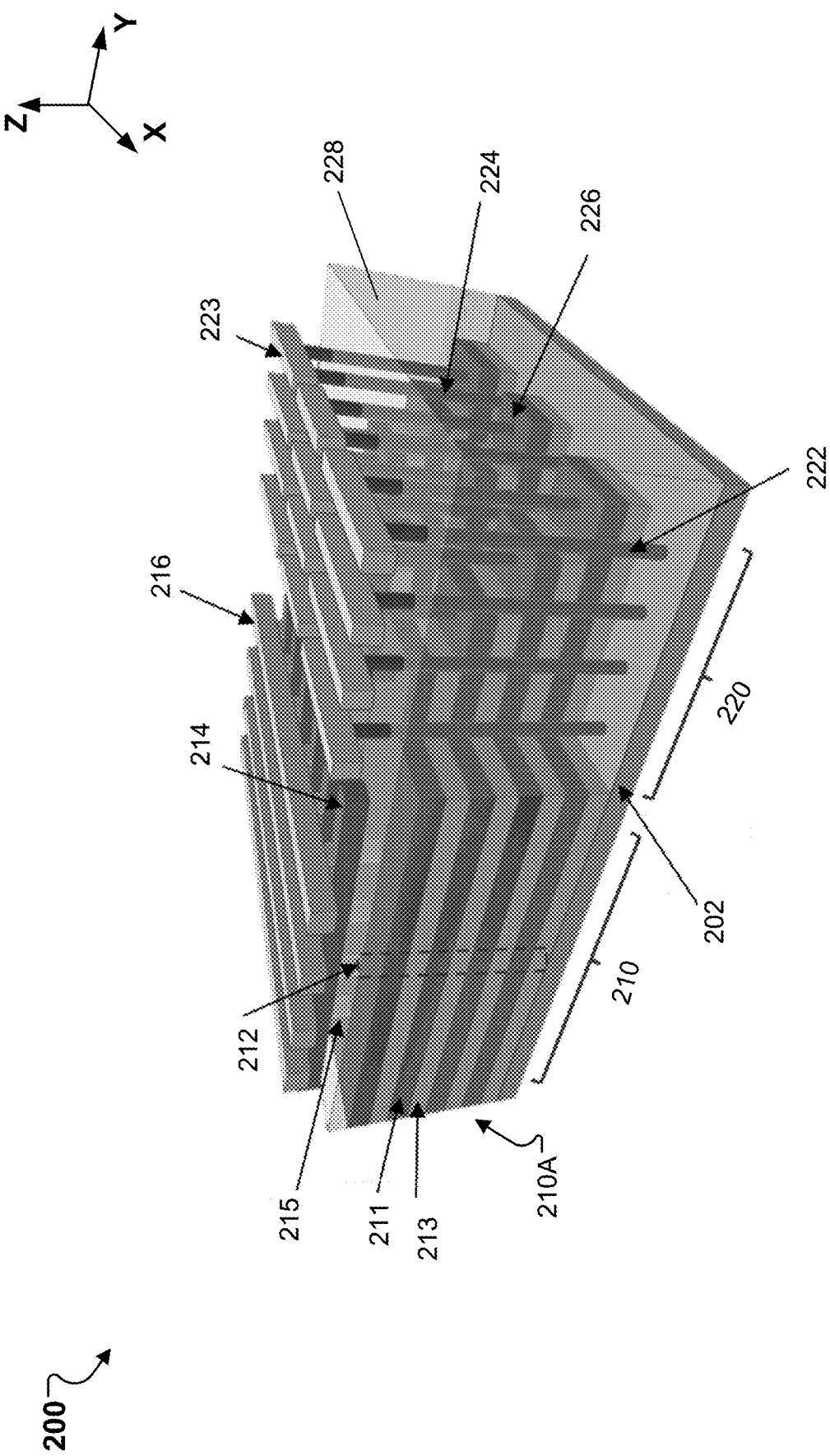
FIG. 2 is a schematic diagram of an example 3D memory device.

FIG. 2 illustrates a perspective view of an example 3D memory device 200. The 3D memory device 200 can be implemented as the memory 116 of FIG. 1A. The 3D memory device 200 includes a memory cell array 210 and a staircase structure 220 configured to conductively connect the memory cell array to a driving circuit, e.g., a circuit under array (CuA) layer 202. The CuA layer 202 can integrate one or more circuits formed on or in a substrate. The substrate can include one or any combination of silicon, doped silicon, germanium, silicon germanium, semiconductor compounds, or other semiconductor materials.

The memory cell array 210 includes a number of vertical channels (VCs) (or channel pillars) 212. Each VC 212 includes a string of memory cells, e.g., the cell string 144 of FIG. 1B or 154 of FIG. 1C, and is coupled to a corresponding bit line (BL) 216 through a corresponding conductive plug 215. A conductive plug 215 extends through at least an insulating layer and connects a conductive layer on top of the conductive plug 215 and another conductive layer on bottom of the conductive plug 215.

The VCs 212 are conductively coupled to the CuA layer 202. In some implementations, the CuA layer 202 includes a plurality of active devices, such as transistors and a number of conducive lines that are electrically coupled to the conductive layers 211 (gate layer or word line layer). As discussed with further details in FIGS. 4B-4C, a metal-insulator-metal (MIM) capacitor can be formed in the CuA layer 202.

The VCs 212 penetrates downwards through multiple alternating pairs of conductive layers 211 (gate layer or word line layer) and insulating layers 213. The insulating layers 213 can be made of a dielectric material, e.g., oxide. The conductive layers 211 can be made of a conductive material, e.g., a metal such as Tungsten (W). The conductive layers can form one more string select lines (SSL) 214, e.g., SSL 156 of FIG. 1C, one or more word lines (WLs) 211, e.g., WL 157 of FIG. 1C, and one or more ground select lines (GSL), e.g., GSL 158 of FIG. 1C. The one more string select lines (SSL) 214 are above one or more word lines (WL) 211. The one or more ground select lines (GSL) are below one or more word lines (WL) 211. An external surface of the VC 212 contact the conductive layers 211, which act as gates of the memory cells.

The VC 212s can include multiple layers that can include a tunneling layer, a charge trapping layer, and a blocking layer. The tunneling layer can include a silicon oxide, or a silicon oxide/silicon nitride combination (e.g. Oxide/Nitride/Oxide or ONO). The charge trapping layer can include silicon nitride (SiN) or other materials capable of trapping charges. The blocking layer can include silicon oxide, aluminum oxide, and/or combinations of such materials. The multiple layers can be formed on an internal surface of the VC 212, and polysilicon can be filled in a middle of the VC 212. The filled materials (e.g., the multiple layers and polysilicon) in each VC 212 intersecting the conductive layers 211 can form a string of memory cells along the vertical direction such as Z direction. A bit line pad (BLP) can be formed on a top of the VC 212 to seal the VC 212 such that the interior of the VC 212 is separated from an external environment during processing. The BLP is conductive and can be coupled to a bit line 216 through the conductive plug 215.

The staircase structure 220 is configured to conductively connect word line layers 211 to the CuA layer 202. As illustrated in FIG. 2, a staircase structure is formed as an extension of the memory cell array 210, such that each word line layer 211 can be individually connected to a corresponding word line layer contact (WL COA) 224 at a landing area 226. The corresponding word line layer contact 224 is conductively coupled to a respective contact pad in the CuA layer 202 through a corresponding through array contact (TAC) 222 that penetrates through an insulating material 228 filled in the staircase structure 220. The corresponding word line layer contact 224 is conductively coupled to the corresponding TAC 222 through a conductive interconnection 223. A TAC 222 or a word line layer contact 224 can be also a conductive via or pillar. A conductive via is an electrical connection between two or more adjacent conductive layers. A conductive via can include a drilled hole that goes through the two or more adjacent conductive layers and is plated with one or more conductive materials to form an electric connection between the two or more adjacent conductive layers. As discussed with further details in FIG. 4A, an MIM capacitor can be formed near the staircase structure 220 and be peripheral to the memory cell array 210.

Figure 3:
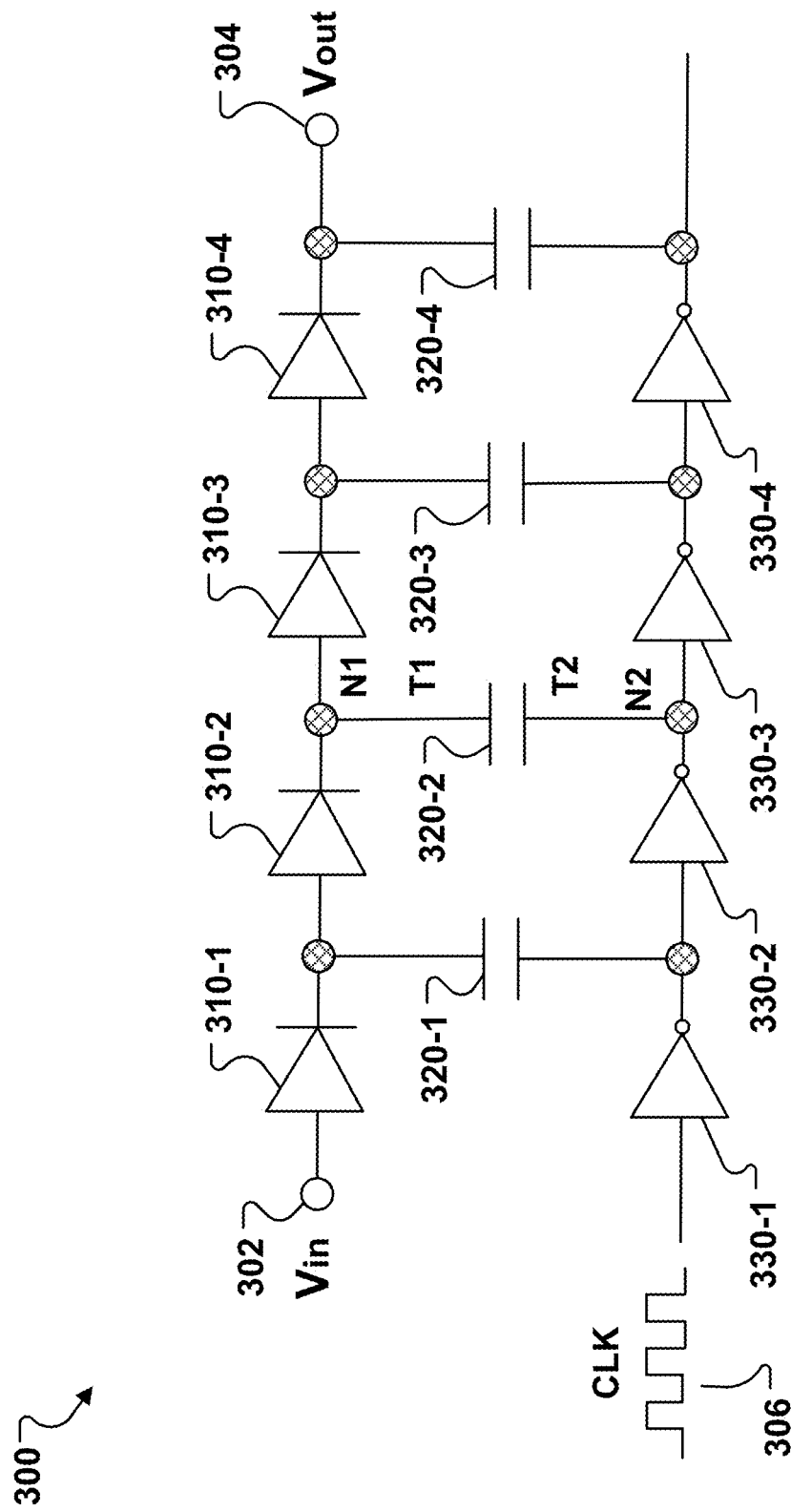
FIG. 3 is a schematic diagram of an example charge pump including capacitors.

A charge pump includes a converter that uses capacitors for energetic charge storage to raise or lower a voltage. FIG. 3 is a schematic diagram of an example charge pump 300. The charge pump 300 is used to boost a lower input voltage Vin at an input node 302 to a higher output Voltage Vout at an output node 304.

As illustrated in FIG. 3, the charge pump 300 includes a number of pump stages. Each pump stage includes a diode 310-1, 310-2, 310-3, 310-4 (referred to generally as diodes 310 and individually as diode 310) and a capacitor 320-1, 320-2, 320-3, 320-4 (referred to generally as capacitors 320 and individually as capacitor 320). A capacitor, e.g., the capacitor 320-2, has a first terminal T1 coupled to a first node N1 between a diode, e.g., the diode 310-2, and a sequential pump stage or diode, e.g., the diode 310-3. A second terminal T2 of the capacitor, e.g., the capacitor 320-2, is coupled to a second node N2 and configured to receive a clock signal. The charge pump 300 uses the diodes 310 to control the connection of voltages to the capacitors 320 using opposite clock signals.

In some cases, opposite clock signals are obtained by providing two opposite clock signals to adjacent pump stages (or adjacent capacitors). In some cases, as shown in FIG. 3, the charge pump 300 includes inverters 330-1, 330-2, 330-3, 330-4 (referred to generally as inverters 330 and individually as inverter 330) configured to convert an input clock signal. An inverter can be constructed using a single n-channel transistor or a single p-channel transistor. In such a way, capacitors 320-2 and 320-4 receive a clock (CLK) signal 306, and capacitors 320-1 and 320-3 receive an inverted clock signal of the clock signal 306.

As an example, when the clock signal 306 is high, the diode 310-1 charges the capacitor 320-1 to Vin. When the clock signal 306 goes low the first terminal N1 of the capacitor 320-1 is pushed up to 2Vin. The diode 310-1 is then turned off and the diode 310-2 is turned on and the capacitor 320-2 begins to charge to 2Vin. On the next clock cycle, the clock signal 306 again goes high, pushing the first terminal T1 of the capacitor 320-2 to 3Vin. The diode 310-2 then switches off and the diode 310-3 switches on, charging the capacitor 320-3 to 3Vin. Repeatedly, Vout can be charged up to 5 Vin for the four-stage charge pump 300.

A memory device can include at least one charge pump configured to boost a lower input voltage to a higher bias voltage to be applied to word lines/bit lines in read, write or erase operations. To improve a density of the memory device (e.g., the 3D memory device 200 of FIG. 2), a number of word lines (e.g., the word line layers 211 of FIG. 2) can be increased, which can increase a need for a large capacitance of a charge pump.

Implementations of the present disclosure provide methods and techniques for capacitors in memory devices, which can obtain the capacitors having stable yet large capacitances, but having reduced areas without increasing manufacturing cost. A memory device can include one or more metal-insulator-metal (MIM) capacitors. An MIM capacitor can include multiple conductive layers (e.g., metal layers) with insulation layers therebetween. Adjacent conductive layers are conductively coupled through one or more conductive vias in a corresponding insulation layer. A conductive layer is configured to include first conductive parts and second conductive parts that are conductively coupled to first and second terminals of the MIM capacitor and form one or more subordinate capacitors, which can increase a capacitance value of the MIM capacitor. Moreover, the conductive vias separately coupled to the first and second conductive parts of the adjacent conductive layers can also be configured to form at least one additional subordinate capacitor to further increase the capacitance value of the MIM capacitor. In such a way, the MIM capacitor can have a large capacitance without enlarging an area of the MIM capacitor or with a decreased area. The MIM capacitor can be formed under a memory cell array of the memory device (e.g., in the CuA layer 202 of FIG. 2), as illustrated with further details in FIGS. 4B-4C. The MIM capacitor can also be formed in an area peripheral to the memory cell array (e.g., in the staircase structure 220 of FIG. 2), as illustrated with further details in FIG. 4A. The MIM capacitor can be coupled to any suitable component or device, e.g., a transistor.

Figure 4A:
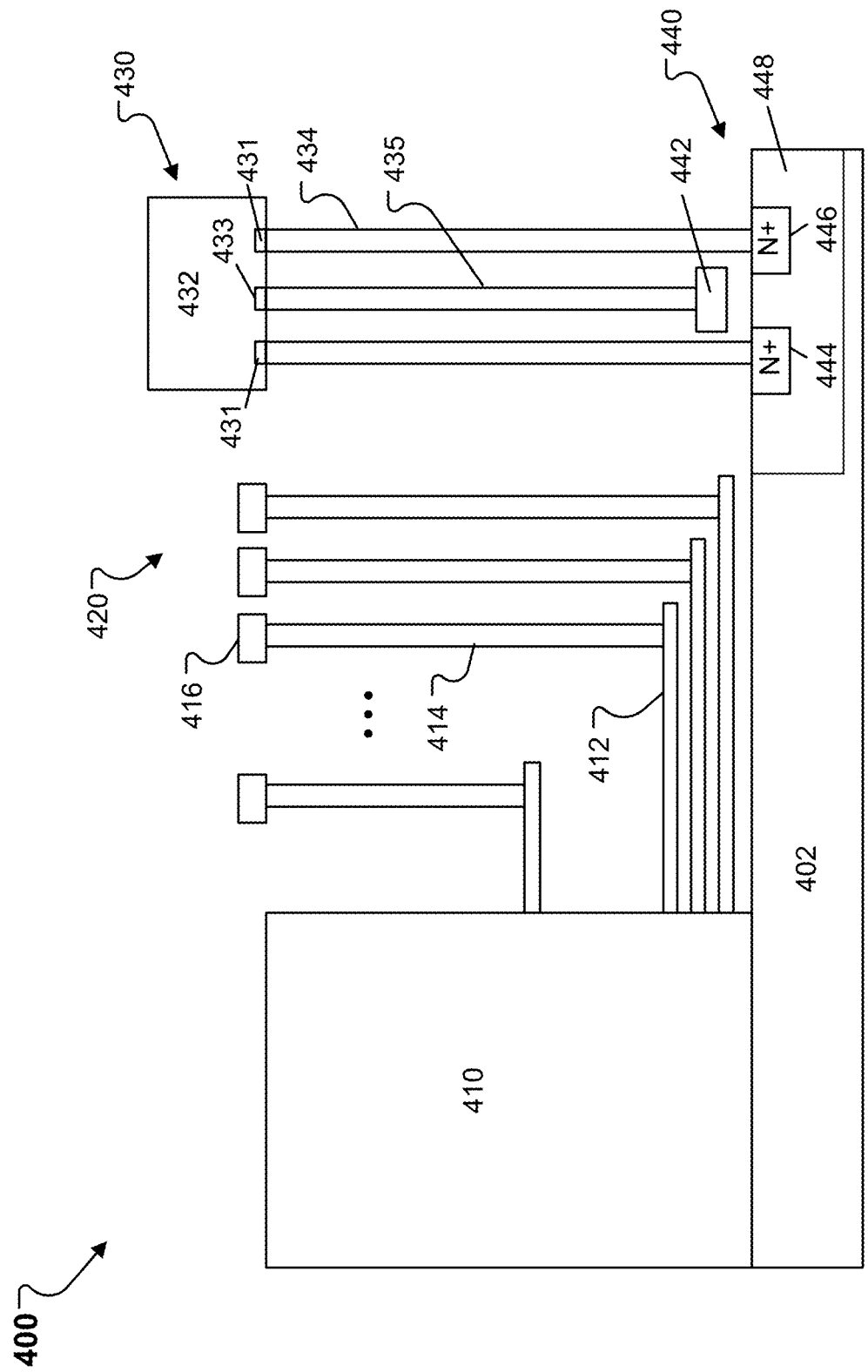
FIG. 4A is a schematic diagram of an example metal-insulator-metal (MIM) capacitor in a peripheral of a 3D memory device.

FIG. 4A is a schematic diagram of a memory device 400 including an example metal-insulator-metal (MIM) capacitor 430. The memory device 400 can be implemented as the memory 116 of FIG. 1A or the memory device 200 of FIG. 2.

The memory device 400 includes a substrate 402 and a memory cell array 410 (e.g., the memory cell array 210 of FIG. 2) formed above the substrate 402. The substrate 402 can include one or any combination of silicon, doped silicon, germanium, silicon germanium, semiconductor compounds, or other semiconductor materials. A circuit layer (e.g., the CuA layer 202 of FIG. 2) can be formed on or in the substrate 402. The circuit layer can include one or more integrated circuits that are conductively coupled to the memory cell array 410.

The memory cell array 410 includes a number of word line layers 412 (e.g., the conductive layers 211 of FIG. 2). As illustrated in FIG. 4, a staircase structure 420 (e.g., the staircase structure 220 of FIG. 2) is formed as an extension of the memory cell array 410, such that each word line layer 412 can be individually connected to a corresponding word line layer contact 414 (e.g., the word line layer contact 224 of FIG. 2). The corresponding word line layer contact 414 is electrically coupled to a respective contact pad in the circuit layer through a corresponding through array contact (TAC) that penetrates through one or more insulating materials in a region without the staircase structure 420. The corresponding word line layer contact 414 is conductively coupled to the corresponding TAC through a conductive interconnection 416. The TAC can be the TAC 222 of FIG. 2. The TAC can be a conductive plug or pillar.

The memory device 400 includes one or more capacitors. As illustrated in FIG. 4A, a metal-insulator-metal (MIM) capacitor 430 can be formed peripheral to the memory cell array 410. The MIM capacitor 430 includes at least a first terminal 431 (e.g., T1 of FIG. 3), at least a second terminal 433 (e.g., T2 of FIG. 3), and a capacitance structure 432. The first terminal 431 can include a ring structure or two or more connected parts. The capacitance structure 432 can be formed above the memory cell array 410, e.g., in one or more top layers of the memory device 400. The first terminal 431 and the second terminal 433 are conductively isolated from each other in the MIM capacitor 430.

Figure 5:
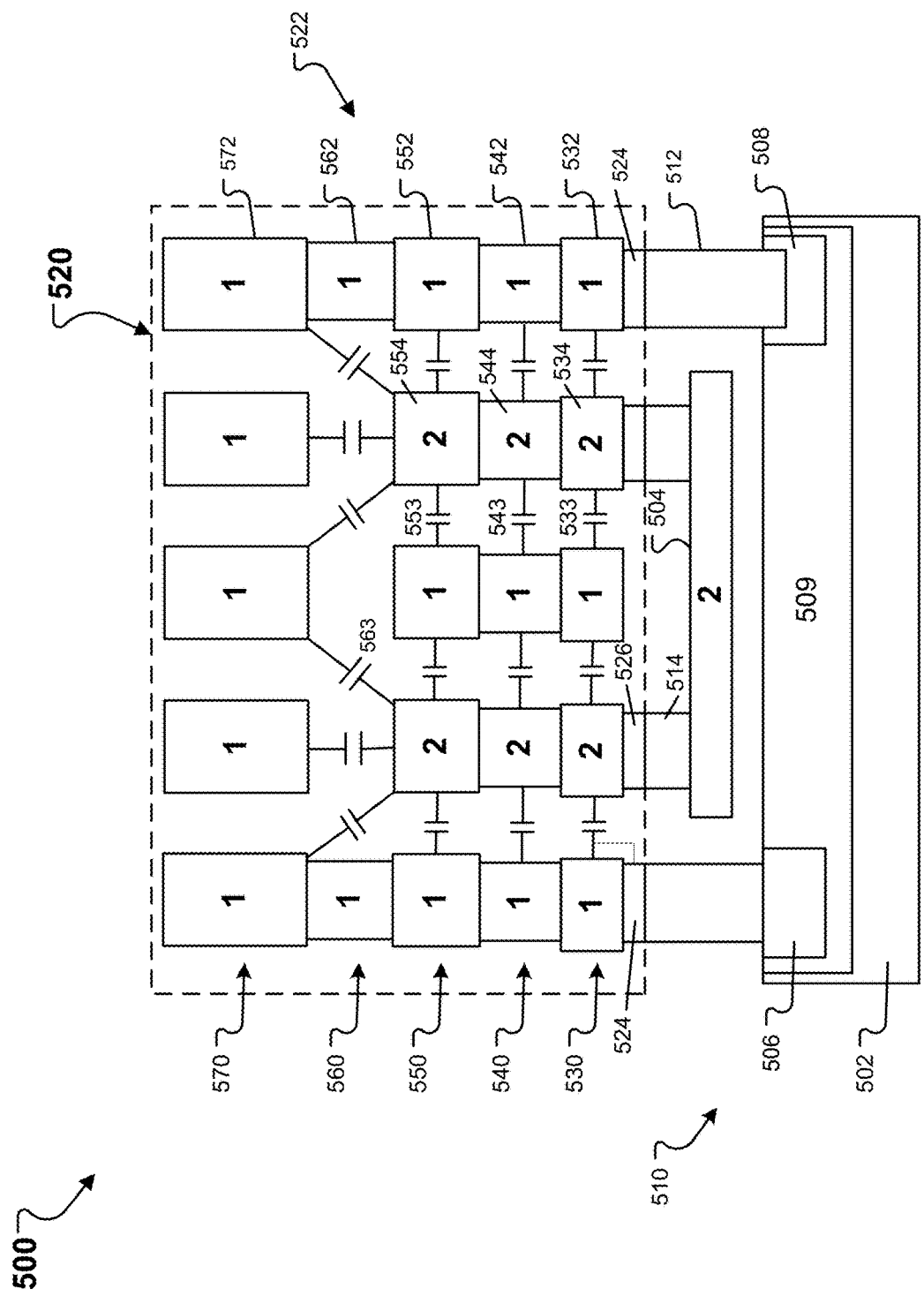
FIG. 5 is a schematic diagram of an example MIM capacitor.

The MIM capacitor 430 can be a capacitor 520 of FIG. 5. As discussed with further details in FIG. 5, the capacitance structure 432 can include multiple conductive layers with insulation layers therebetween. Each conductive layer has one or more first conductive parts electrically coupled to the first terminal 431 and one or more second conductive parts conductively coupled to the second terminal.

In one example as illustrated in FIG. 4A, the MIM capacitor 430 can be configured to be conductively connected to a transistor 440 (e.g., a metal-oxide-silicon (MOS) transistor) that has a gate 442, a source 444, and a drain 446. The source 444 and the drain 446 can be two doped regions (e.g., N-doped regions) in a well region 448 (e.g., a P-well region or an N-well region) in the substrate 402. The gate 442 can be a metal plate insulated from the well region 448, e.g., by an insulating material. The first terminal 431 of the MIM capacitor 430 can be conductively and respectively coupled to the source 444 and the drain 446 of the transistor 440 through two or more first conductive contacts 434. The second terminal 433 can be conductively coupled to the gate 442 of the transistor through one or more second conductive contacts 435. Each of the first conductive contacts 434 and the second conductive contacts 435 can be a TAC (e.g., the TAC 222 of FIG. 2) that can be a conductive plug or pillar.

Figure 4C:
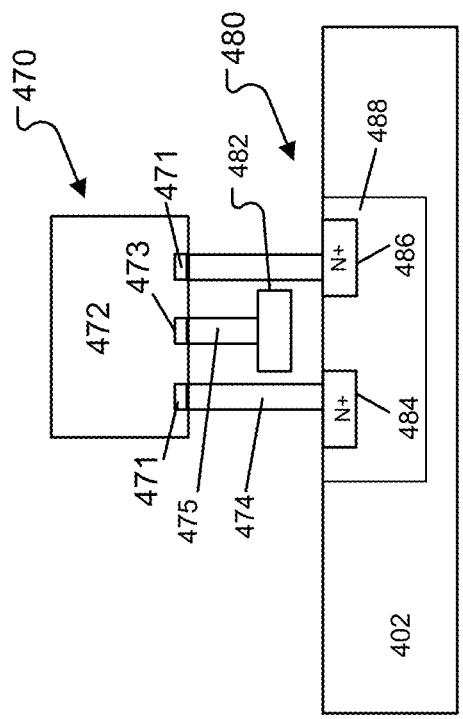
FIGS. 4B-4C are schematic diagrams of another example MIM capacitor under a memory cell array of a 3D memory device.
Figure 4B:
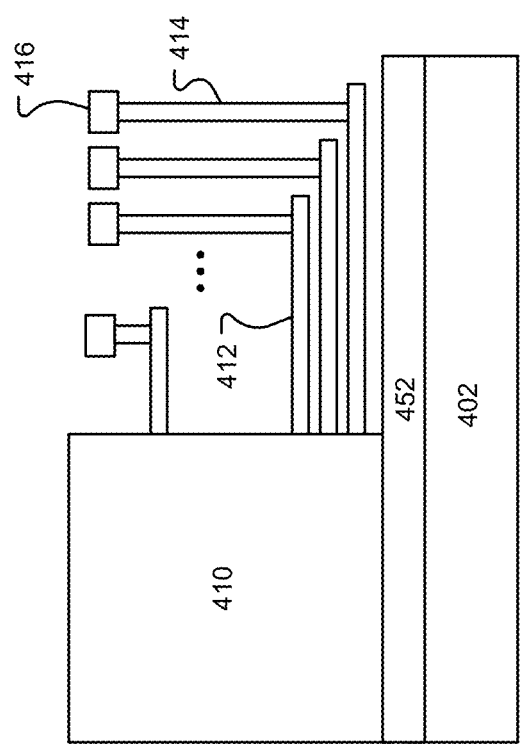

FIGS. 4B-4C are schematic diagrams showing a memory device 450 including another example metal-insulator-metal (MIM) capacitor 470. The memory device 450 can be implemented as the memory 116 of FIG. 1A or the memory device 200 of FIG. 2. The memory device 450 can be similar to the memory device 400 of FIG. 4A. Different from the memory device 400 where the MIM capacitor 430 is formed peripheral to the memory cell array 410, the MIM capacitor 470 is formed under a memory cell array 410 and in a circuit layer 452 (e.g., the CuA layer 202 of FIG. 2) that is in or on a substrate 402.

Similar to the MIM capacitor 430, as illustrated in FIG. 4C, the MIM capacitor 470 includes at least a first terminal 471, at least a second terminal 473, and a capacitance structure 472. Similar to the MIM capacitor 430, the MIM capacitor 470 can be configured to be coupled to a transistor 480 (e.g., a metal-oxide-silicon (MOS) transistor) that has a gate 482, a source 484, and a drain 486. The source 484 and the drain 486 can be two doped regions (e.g., N-doped regions) in a well region 488 (e.g., a P-well region or an N-well region) in the substrate 402. The gate 482 can be a metal plate insulated from the well region 488, e.g., by an insulating material. The first terminal 471 of the MIM capacitor 470 can be conductively and respectively coupled to the source 484 and the drain 486 of the transistor 480 through two or more first conductive contacts 474. The second terminal 473 can be conductively coupled to the gate 482 of the transistor through one or more second conductive contacts 475. Each of the first conductive contacts 474 and the second conductive contacts 475 can be a TAC (e.g., the TAC 222 of FIG. 2) that can be a conductive contact.

The MIM capacitor 470 can be a capacitor 520 of FIG. 5. As discussed with further details in FIG. 5, the capacitance structure 472 can include multiple conductive layers with insulation layers therebetween. Each conductive layer has one or more first conductive parts electrically coupled to the first terminal 471 and one or more second conductive parts conductively coupled to the second terminal 473. Different from the first conductive contacts 434 and the second conductive contacts 435 that are TACs, each of the first conductive contacts 474 and the second conductive contacts 475 can be a conductive via formed in the circuit layer 452, which is under the memory cell array 410.

In some implementations, a memory device includes one or more MIM capacitors 430 formed peripheral to a memory cell array 410. In some implementations, a memory device includes one or more MIM capacitors 470 formed under the memory cell array 410. In some implementations, a memory device includes at least one MIM capacitor 430 formed peripheral to the memory cell array 410 and at least one MIM capacitor 470 formed under the memory cell array 410.

FIG. 5 is a schematic diagram of a device 500 including an example MIM capacitor 520. The MIM capacitor 520 can be implemented as the MIM capacitor 430 of FIG. 4A or the MIM capacitor 470 of FIG. 4C. The MIM capacitor 520 is configured to form a number of subordinate capacitors to increase a capacitance of the MIM capacitor 520.

In some embodiments, the device 500 includes a transistor 510 (e.g., the transistor 440 of FIG. 4A or 480 of FIG. 4C) coupled to the MIM capacitor 520. As shown in FIG. 5, the transistor 510 includes a gate 504 (e.g., the gate 442 of FIG. 4A or 482 of FIG. 4C), a source 506 (e.g., the source 444 of FIG. 4A or 484 of FIG. 4C), and a drain 508 (e.g., the drain 446 of FIG. 4A or 486 of FIG. 4C). The source 506 and the drain 508 can be two doped regions (e.g., a P-type region or an N-type region) in a well region 509 (e.g., 448 of FIG. 4A or 488 of FIG. 4C) formed in a substrate 502 (e.g., the substrate 402 of FIG. 4A, 4B, or 4C). The gate 504 can be a metal plate.

The MIM capacitor 520 includes a first terminal 524 (e.g., T1 of FIG. 3, or the first terminal 431 of FIG. 4A or 471 of FIG. 4C) and a second terminal 526 (e.g., T2 of FIG. 3, or the second terminal 433 of FIG. 4A or 473 of FIG. 4C). The second terminal 526 is insulated from the first terminal 524, e.g., by an insulating material such as a dielectric material. Note that a part labelled with "1" indicates that the part is conductively coupled to the first terminal 524, and a part labelled with "2" indicates that the part is conductively coupled to the second terminal 526. The first terminal 524 can include at least two parts respectively coupled to the source 506 and the drain 508 of the transistor 510 through corresponding conductive contacts 512 (e.g., 434 of FIG. 4A or 474 of FIG. 7C). The second terminal 526 can include one or more parts coupled to the gate 502 of the transistor 510 through one or more corresponding conductive contacts 514 (e.g., 435 of FIG. 4A or 475 of FIG. 4C).

The MIM capacitor 520 includes a capacitance structure 522 (e.g., the capacitance structure 432 of FIG. 4A or 472 of FIG. 4C) that is formed above the first terminal 524, and the second terminal 526. The capacitance structure 522 includes a number of layers 530, 540, 550 that are sequentially stacked together. The capacitance structure 522 includes multiple conductive layers 530, 550 that are separated by an insulation layer 540.

Each of the conductive layers 530, 550 includes one or more first conductive parts 532, 552 and one or more second conductive parts 534, 554. In the conductive layer 530 or 550, each second conductive part 534 or 554 is insulated from the one or more first conductive parts 532 or 552, e.g., by an insulating material such as a dielectric material. The conductive layer 530 or 550 is configured, e.g., as illustrated with further details in FIGS. 6A-6B, 7 and 8, such that at least one (or each) second conductive part 534 or 554 is between one or more adjacent first conductive part 532 or 552 and forms at least one subordinate capacitor 533 or 553 with the one or more adjacent first conductive part 532 or 552. In such a way, a capacitance of the MIM capacitor 500 can be increased.

The insulation layer 540 includes one or more first conductive vias 542 and one or more second conductive vias 544. Each second conductive via 544 is insulated from the one or more first conductive vias 542, e.g., by an insulating material such as a dielectric material. The insulation layer 540 is configured, e.g., as illustrated with further details in FIGS. 6A-6B, 7 and 8, such that at least one (or each) second conductive via 544 is between by one or more adjacent first conductive vias 542 and forms at least one subordinate capacitor 543 with the one or more adjacent first conductive vias 542, which can further increase the capacitance of the MIM capacitor 500.

Each of the one or more first conductive parts 552 in the conductive layer 550 is conductively (e.g., electrically) coupled (or connected) to a corresponding first conductive part 532 in the conductive layer 530 through a corresponding first conductive via 542 in the insulation layer 540. Each of the one or more first conductive part 532 in the conductive layer 530 is conductively coupled to the first terminal 524. The first terminal 524 can be further coupled to a corresponding one of the source and drain 506, 508 of the transistor 510 through a corresponding first conductive contact 512 (e.g., the first conductive contacts 434 of FIG. 4A or 474 of FIG. 4C).

Each of the one or more second conductive parts 554 in the conductive layer 550 is conductively coupled to a corresponding second conductive part 534 in the conductive layer 530 through a corresponding second conductive via 544 in the insulation layer 540. Each of the one or more second conductive part 534 in the conductive layer 530 is conductively coupled to the second terminal 526. The second terminal 526 can be further coupled to the gate 504 of the transistor 510 through a corresponding second conductive contact 514 (e.g., the second conductive contacts 433 of FIG. 4A or 473 of FIG. 4C). At least one (or each) second conductive contact 514 is insulated from one or more adjacent first conductive contact 512, e.g., by an insulating material such as a dielectric material.

A top layer 570 is formed on a top of the capacitance structure 522, and conductively coupled to the conductive layers 550 through conductive vias 562 in the insulation layer 560. The top layer 570 can be configured to include a plurality of first conductive parts 572 that each are conductively coupled to the first terminal 524. As illustrated in FIG. 5, the top layer 570 can include no second conductive part conductively coupled to the second terminal 526. The insulation layer 560 can include first conductive vias 562 that are conductively coupled to the first terminal 524. As illustrated in FIG. 5, the insulation layer 560 can include no second conductive via conductively coupled to the second terminal 526. The top layer 570 and the insulation layer 560 are configured, e.g., as illustrated in FIG. 5, such that at least one (or each) second conductive part 554 in the conductive layer 550 forms at least one (e.g., three) subordinate capacitor 563 with one or more adjacent first conductive part 572 in the top layer 570. The formed at least one subordinate capacitor 563 can further increase the capacitance of the MIM capacitor 500. The subordinate capacitor 563 is an inter-layer capacitor, compared to other subordinate capacitors 533, 543, 553 that are intra-layer capacitors.

Figure 6A:
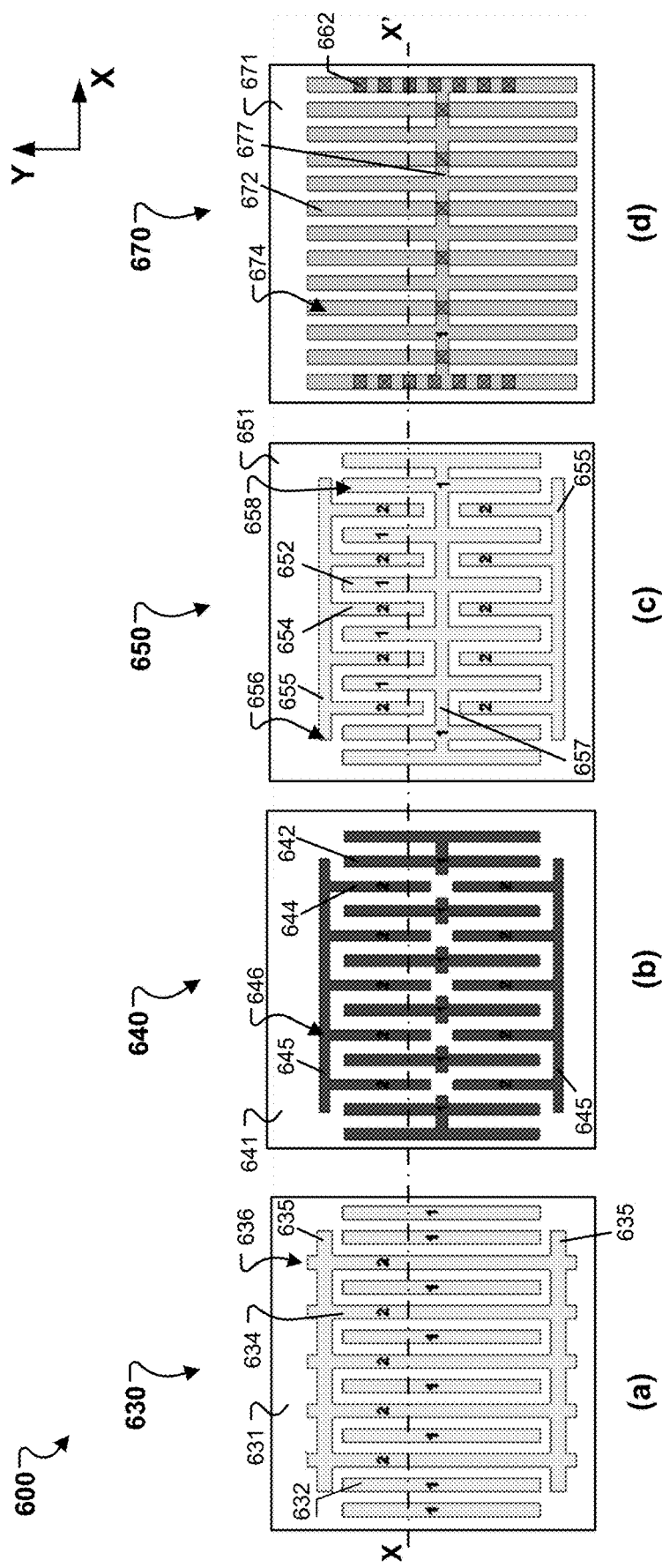
FIG. 6A shows layout diagrams of an example of multiple stacked layers of an MIM capacitor.
Figure 6B:
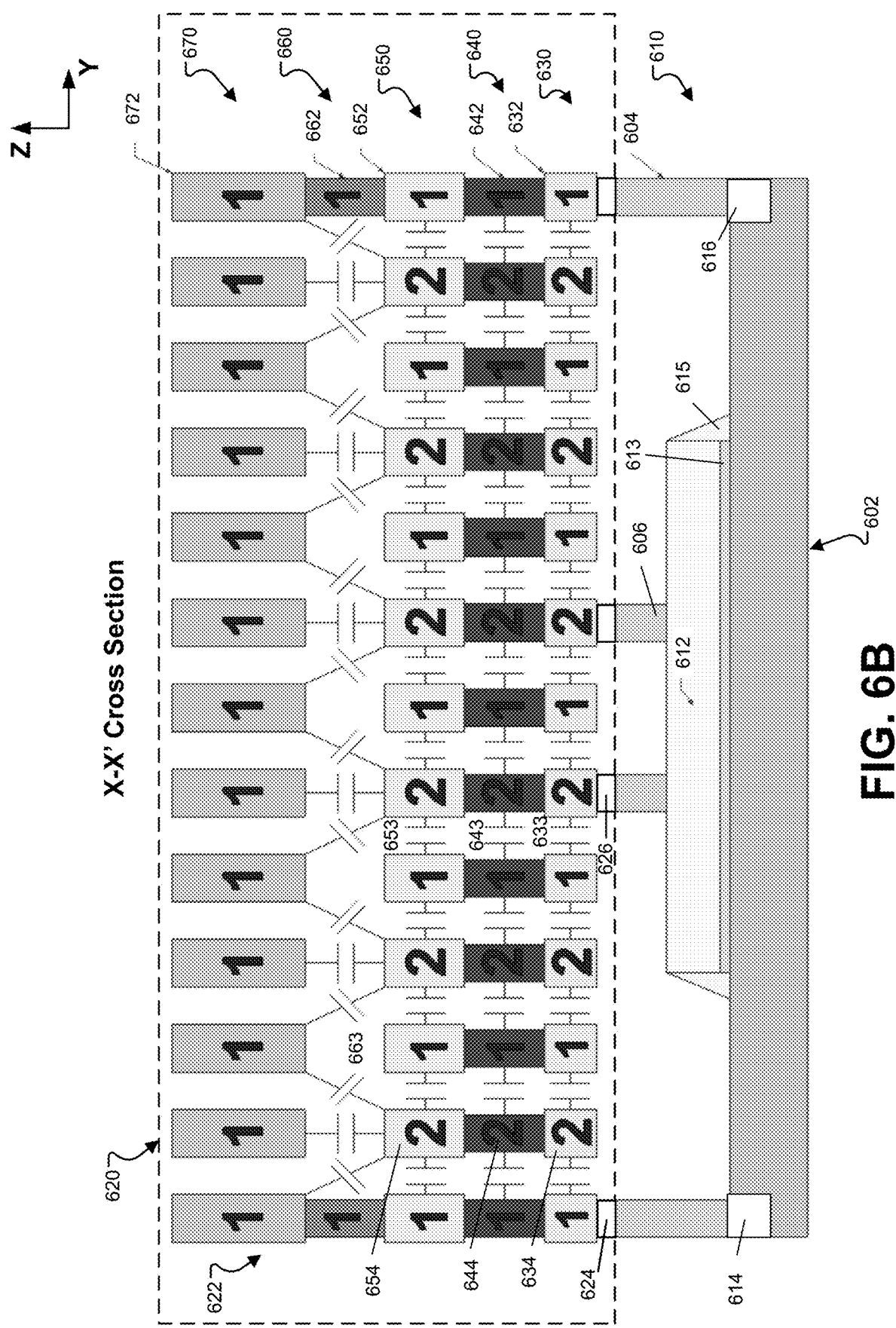
FIG. 6B shows a cross-sectional view of the MIM capacitor.

FIGS. 6A-6B show an example of a device 600 (e.g., the device 500 of FIG. 5) including a capacitor 620 (e.g., the MIM capacitor 520 of FIG. 5) having multiple stacked layers 630, 640, 650, 660, 670. FIG. 6A shows layout diagrams of the multiple stacked layers of the capacitor 620, and FIG. 6B shows X-X' cross sectional view of the device 600.

The capacitor 620 includes a capacitance structure 622 (e.g., 522 of FIG. 5), a first terminal 624 (e.g., 524 of FIG. 5), and a second terminal 626 (e.g., 526 of FIG. 5). In one example, the capacitor 620 can be coupled to a transistor 610 (e.g., the transistor 510 of FIG. 5) in the device 600. The transistor 610 includes a gate 612 (e.g., 504 of FIG. 5), a source 614 (e.g., 506 of FIG. 5), and a drain 616 (e.g., 508 of FIG. 5). The source 614 and the drain 616 can be formed in a substrate 602 (e.g., 502 of FIG. 5). The gate 612 can be conductively isolated from the substrate 602, e.g., via a dielectric layer 613, and from a surrounding medium via spacers 615. The first terminal 624 can be coupled to a corresponding one of the source and drain 614, 616 of the transistor 610 through a corresponding first conductive contact 604 (e.g., the first conductive contacts 434 of FIG. 4A or 474 of FIG. 4C or 512 of FIG. 5). The second terminal 626 can be coupled to the gate 612 of the transistor 610 through a corresponding second conductive contact 606 (e.g., the second conductive contacts 433 of FIG. 4A or 473 of FIG. 4C or 514 of FIG. 5).

With respect to FIG. 6A, diagram (a) shows a layout of a first conductive layer 630 (e.g., the conductive layer 530 of FIG. 5). Diagram (b) shows a layout of an insulation layer 640 (e.g., the insulation layer 540 of FIG. 5). Diagram (c) shows a layout of a second conductive layer 650 (e.g., the conductive layer 550 of FIG. 5). Diagram (d) shows a layout of a top layer 670 (e.g., the top layer 570 of FIG. 5) and another insulation layer 660 (e.g., the insulation layer 560 of FIG. 5). Note that, in the capacitor 620, a part labelled with "1" indicates that the part is conductively coupled to the first terminal 624, and a part labelled with "2" indicates that the part is conductively coupled to the second terminal 626.

As shown in diagram (a) of FIG. 6A, the conductive layer 630 can include a number of alternating first conductive stripe 632 (e.g., the first conductive part 532 of FIG. 5) and second conductive stripe 634 (e.g., the second conductive part 534 of FIG. 5). The first conductive stripes 632 are insulated from the second conductive stripes 634 by an insulating material 631 (e.g., a dielectric material such as oxide). Each second conductive stripe 634 is between two adjacent first conductive stripes 632 and can form at least two subordinate capacitors 633 (e.g., the capacitors 533 of FIG. 5). The second conductive stripes 634 can be physically connected to form an integrated structure 636, such that the second conductive stripes 634 can be conductively connected together to the second terminal 626. In the example of diagram (a) of FIG. 6A, the second conductive stripes 634 are parallel to each other and extend along a first direction (e.g., Y direction). Each second conductive stripe 634 has a first end and a second end. Two separated third conductive stripes 635 extend along a second direction (e.g. X direction). Each third conductive stripe 635 connects adjacent to the first end and the second end of each second conductive stripe 634, respectively. The second conductive stripes 634 and the third conductive stripes 635 can be physically connected to form the integrated structure 636. The second conductive stripes 634 can extend out of the third conductive stripes 635 along the first direction. The first conductive stripes 632 in the conductive layer 630 can be individually and physically separated.

As shown in diagram (c) of FIG. 6A, the conductive layer 650 can include a number of alternating first conductive stripe 652 (e.g., the first conductive part 552 of FIG. 5) and second conductive stripe 654 (e.g., the second conductive part 554 of FIG. 5). The first conductive stripes 652 are insulated from the second conductive stripes 654 by an insulating material 651 (e.g., a dielectric material such as oxide). Each second conductive stripe 654 is between two adjacent first conductive stripes 652 and can form at least two subordinate capacitors 653 (e.g., the capacitors 553 of FIG. 5). The second conductive stripes 654 are parallel to each other and extend along the first direction (e.g., Y direction). Each second conductive stripe 654 has a first end and a second end. In some examples, as shown in diagram (c) of FIG. 6A, the second conductive stripes 654 are connected together by two separated third conductive stripes 655 to form two integrated structures 656. Each third conductive stripe 655 extends along the second direction (e.g. X direction). Each third conductive stripe 655 connects to the first end of corresponding second conductive stripes 654, respectively. The third conductive stripe 655 and the corresponding second conductive stripes 654 can be physically connected to form a corresponding integrated structure 656. Each integrated structure 656 can include multiple trenches inserted with the corresponding first conductive stripes 652. The first conductive stripes 652 can also be physically connected together by a fourth conductive stripe 657 to form an integrated structure 658 that includes multiple trenches inserted with corresponding second conductive stripes 654. The fourth conductive stripe 657 extends along the second direction (e.g., X direction), parallel to the third conductive stripes 655.

As shown in diagram (b) of FIG. 6A, the layout of the insulation layer 640 is substantially same as the layout of the conductive layer 650. The insulation layer 640 includes a number of alternating first conductive via 642 (e.g., the first conductive via 542 of FIG. 5) and second conductive via 644 (e.g., the second 544 of FIG. 5). Each of the first conductive via 642 and the second conductive via 644 can be a conductive stripe. A layout of the first conductive vias 642 and the second conductive vias 644 in the insulation layer 640 can be substantially same as a layout of the first conductive stripes 642 and the second conductive stripes 644 in the conductive layer 650. The first conductive vias 642 are insulated from the second conductive vias 644 by an insulating material 641 (e.g., a dielectric material such as oxide). Each second conductive via 644 is between two adjacent first conductive vias 642 and can form at least two subordinate capacitors 643 (as shown in FIG. 6B). In some examples, as shown in (b) of FIG. 6A, the second conductive vias 644 are connected together to form two integrated structures 646. In the example in (b) of FIG. 6A, the second conductive vias 644 include a first group and a second group. The second conductive vias 644 in the first group are parallel to each other and extend along the first direction (e.g., Y direction). Each second conductive via 644 in the first group has a first end connecting to a third conductive via 645, which extends along the second direction (e.g. X direction). The second conductive vias 644 in the second group are parallel to each other and extend along the first direction (e.g., Y direction). Each second conductive via 644 in the second group has a second end connecting to another third conductive via 645, which extends along the second direction (e.g., X direction). Each second conductive via 644 in the first group and each second via 644 in the second group extend from the corresponding third conductive vias 645 toward each other. Each second conductive via 644 in the first group and each second conductive via 644 in the second group are separated with a distance. Each integrated structure 646 can include multiple insulators inserted with corresponding first conductive vias 642. The first conductive vias 642 can be separated (or insulated) from each other. In some examples, as illustrated in diagram (b) of FIG. 6A, a first conductive via 642 can be a conductive stripe with extensions perpendicular to the stripe, which can increase an area of the first conductive via 642 to further include a capacitance of a subordinate capacitor formed by the first conductive via 642 and an adjacent second conductive via 644.

When the three layers 630, 640, 650 are sequentially stacked together, the first conductive stripes 632 in the conductive layer 630 are conductively connected together by the integrated structure 658 in the conductive layer 650 through the first conductive stripes 642 in the insulation layer 640. When the three layers 630, 640, 650 are sequentially stacked together, the second conductive stripes 654 in the conductive layer 650 are conductively connected together by the integrated structure 636 in the conductive layer 630 through the second conductive stripes 644 in the insulation layer 640.

As shown in diagram (d) of FIG. 6A, the top layer 670 includes a number of first conductive stripes 672 (e.g., the first conductive part 572 of FIG. 5). The first conductive stripes 672 can be connected together by a third conductive stripe 677 (extending along the second direction, e.g., X direction) to form an integrated structure 674. The top layer 670 and the conductive layer 650 can be configured such that each first conductive stripe 672 is above one of the first conductive stripe 652 and the second conductive stripe 654 in the conductive layer 650. The insulation layer 660 includes a number of conductive vias 662 (e.g., the first conductive vias 562 of FIG. 5) that are distributed on the integrated structure 674. Spaces between adjacent first conductive stripes 672 can be separated and insulated by an insulating material 671 (e.g., a dielectric material such as oxide). The first conductive stripes 672 in the top layer 670 are conductively coupled to the first terminal 624 through the conductive vias 662, the first conductive strips 652, the conductive vias 642, and the first conductive strips 632.

Figure 7:
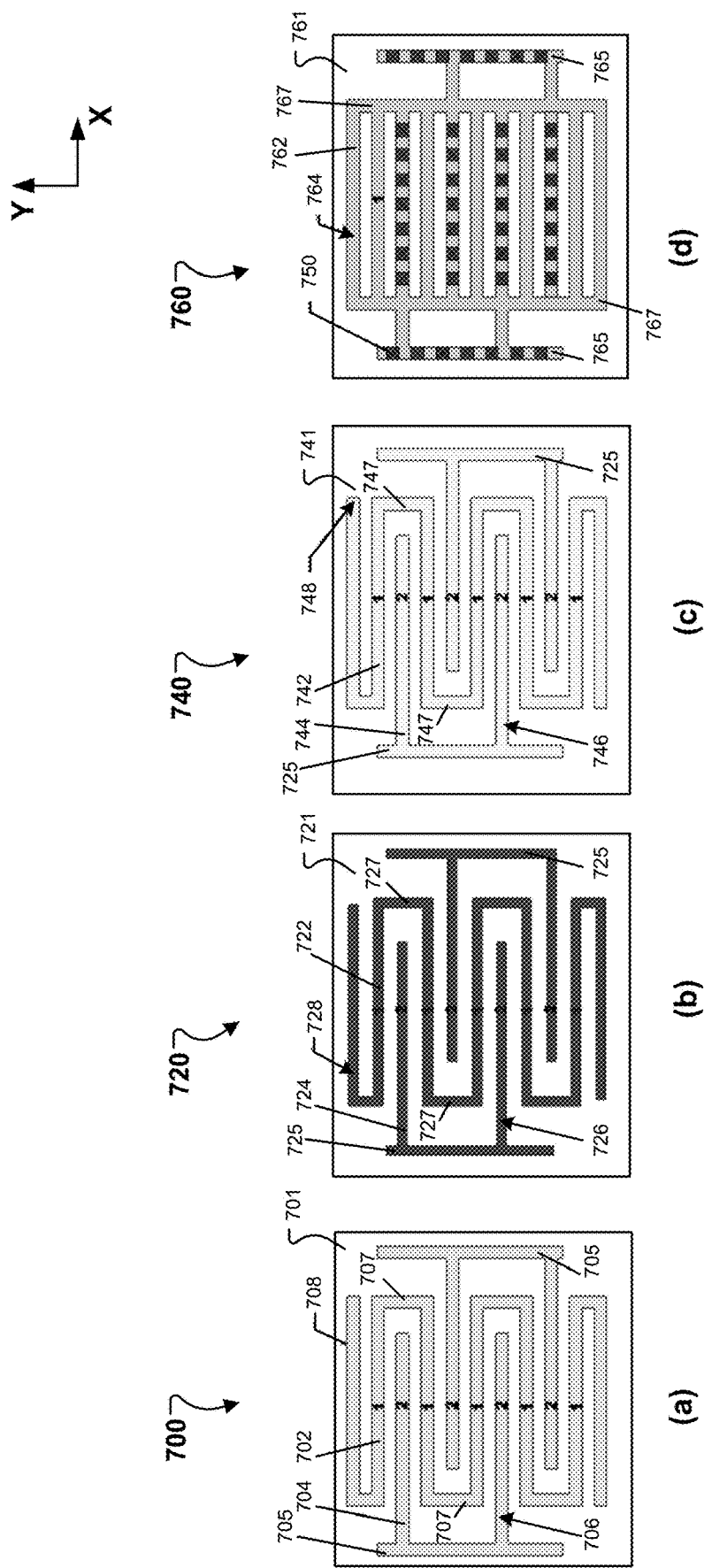
FIG. 7 shows layout diagrams of another example of multiple stacked layers of an MIM capacitor.

FIG. 7 shows layout diagrams of another example of multiple stacked layers of a capacitor, e.g., the MIM capacitor 500 of FIG. 5, including: diagram (a) showing a layout 700 of a first conductive layer (e.g., 530 of FIG. 5 or 630 of FIGS. 6A-6B), diagram (b) showing a layout 720 of a first insulation layer (e.g., 540 of FIG. 5 or 640 of FIGS. 6A-6B), diagram (c) showing a layout 740 of a second conductive layer (e.g., 550 of FIG. 5 or 650 of FIGS. 6A-6B), and diagram (d) showing a layout 760 of a second insulation layer (e.g., 560 of FIG. 5 or 660 of FIGS. 6A and 6B) and a top layer (e.g., 570 of FIG. 5 or 670 of FIGS. 6A-6B). Different from FIGS. 6A-6B where the layout of the insulation layer 640 is different from the layout of the conductive layer 630, the layout 720 of the first insulation layer is substantially same as both the layout of the first conductive layer and the layout 740 of the second conductive layer. Note that, in the capacitor, a part labelled with "1" indicates that the part is conductively coupled to a first terminal of the capacitor (e.g., 524 of FIG. 5 or 624 of FIG. 6B), and a part labelled with "2" indicates that the part is conductively coupled to a second terminal (e.g., 526 of FIG. 5 or 626 of FIG. 6B).

As shown in diagram (a) of FIG. 7, the conductive layer can include a number of alternating first conductive stripe 702 (e.g., the first conductive part 532 of FIG. 5 or the first conductive stripe 632 of FIGS. 6A-6B) and second conductive stripe 704 (e.g., the second conductive part 534 of FIG. 5 or the second conductive stripe 634 of FIGS. 6A-6B). The first conductive stripes 702 are insulated from the second conductive stripes 704 by an insulating material 701 (e.g., a dielectric material such as oxide). Each second conductive stripe 704 is between two adjacent first conductive stripe 702 and can form at least two subordinate capacitors (e.g., the capacitors 533 of FIG. 5 or 633 of FIG. 6B). The first conductive stripes 702 are conductively coupled to the first terminal, and the second conductive stripes 704 are conductively coupled to the second terminal. In some examples, as shown in diagram (a) of FIG. 7, the second conductive stripes 704 are connected together by two separated third conductive stripe 705 to form two corresponding integrated structures 706. Each third conductive stripe 705 extends along a first direction (e.g., Y direction), and each second conductive stripe 704 extends along a second direction (e.g., X direction). Each integrated structure 706 can include multiple trenches inserted with corresponding first conductive stripes 702. The first conductive stripes 702 can also be connected together by multiple separated fourth conductive stripes 707 to form an integrated structure 708 that includes multiple trenches inserted with corresponding second conductive stripes 704. Each first conductive stripe 702 extends along the second direction (e.g., X direction) and each fourth conductive stripe 707 extends along the first direction (e.g., Y direction). Each conductive stripe 704 has a first end physically connected to the corresponding third conductive stripe 705 and a second end extending along the second direction (e.g., X direction) towards the fourth conductive stripe 707 but with a distance from the fourth conductive stripe 707.

As shown in diagram (b) of FIG. 7, the layout 720 is substantially same as the layout 700. The first insulation layer includes a number of alternating first conductive via 722 (e.g., the first conductive via 542 of FIG. 5 or 642 of FIGS. 6A-6B) and second conductive via 724 (e.g., the second conductive via 544 of FIG. 5 or 644 of FIGS. 6A-6B). Each of the first conductive via 722 and the second conductive via 724 can be a conductive stripe. A layout of the first conductive vias 722 and the second conductive via 724 in the first insulation layer can be substantially same as the layout 700 of the first conductive stripes 702 and the second conductive stripes 704 in the first conductive layer. The first conductive vias 722 are insulated from the second conductive vias 724 by an insulating material 721 (e.g., a dielectric material such as oxide). Each second conductive via 724 is between two adjacent first conductive vias 722 and can form at least two subordinate capacitors (e.g., the capacitors 543 of FIG. 5 or 643 of FIG. 6B). In some examples, as shown in (b) of FIG. 7, the second conductive vias 724 are connected together by two separated third conductive stripe 725 to form two corresponding integrated structures 726. Each third conductive stripe 725 extends along a first direction (e.g., Y direction), and each second conductive stripe 724 extends along a second direction (e.g., X direction). Each integrated structure 726 can include multiple trenches inserted with corresponding first conductive vias 722. The first conductive vias 722 can be connected together by multiple separated fourth conductive stripes 727 to form an integrated structure 728 that includes multiple trenches inserted with corresponding second conductive vias 724. Each first conductive stripe 722 extends along the second direction (e.g., X direction) and each fourth conductive stripe 727 extends along the first direction (e.g., Y direction). Each conductive stripe 724 has a first end physically connected to the corresponding third conductive stripe 725 and a second end extending along the second direction (e.g., X direction) towards the fourth conductive stripe 727 but with a distance from the fourth conductive stripe 727.

As shown in diagram (c) of FIG. 7, the layout 740 is substantially same as the layout 720. The second conductive layer can include a number of alternating first conductive stripe 742 (e.g., the first conductive part 552 of FIG. 5) and second conductive stripe 744 (e.g., implemented as the second conductive part 554 of FIG. 5). The first conductive stripes 742 are insulated from the second conductive stripes 744 by an insulating material 741 (e.g., a dielectric material such as oxide). Each second conductive stripe 744 is between two adjacent first conductive stripes 742 and can form at least two subordinate capacitors (e.g., the capacitors 553 of FIG. 5 or 653 of FIG. 6B). In some examples, as shown in diagram (c) of FIG. 7, the second conductive stripes 744 are connected together by two separated third conductive stripe 745 to form two corresponding integrated structures 746. Each third conductive stripe 745 extends along a first direction (e.g., Y direction), and each second conductive stripe 744 extends along a second direction (e.g., X direction). Each integrated structure 746 can include multiple trenches inserted with corresponding first conductive stripes 742. The first conductive stripes 742 can also be connected together by multiple separated fourth conductive stripes 747 to form an integrated structure 748 that includes multiple trenches inserted with corresponding second conductive stripes 744. Each first conductive stripe 742 extends along the second direction (e.g., X direction) and each fourth conductive stripe 747 extends along the first direction (e.g., Y direction). Each conductive stripe 744 has a first end physically connected to the corresponding third conductive stripe 745 and a second end extending along the second direction (e.g., X direction) towards the fourth conductive stripe 747 but with a distance from the fourth conductive stripe 747.

As shown in diagram (d) of FIG. 7, the top layer includes a number of first conductive stripes 762 (e.g., the first conductive part 572 of FIG. 5 or 672 of FIGS. 6A-6B). The first conductive stripes 762 can be connected together by two separated fourth conductive stripes 767 to form an integrated structure 764. Each first conductive stripe 762 is parallel to each other and extends along a second direction (e.g., Y direction). Each first conductive stripe 762 includes a first end and a second end. One fourth conductive stripe 767 extends along a first direction (e.g., Y direction) to physically connect the first ends of the first conductive stripes 762, and the other fourth conductive stripe 767 extends along the first direction to physically connect the second ends of the first conductive stripes 762. The top layer and the second conductive layer can be configured such that each first conductive stripe 762 is above one of the first conductive stripe 742 and the second conductive stripe 744 of the second conductive layer. Spaces between adjacent first conductive stripes 762 can be separated and insulated by an insulating material 761 (e.g., a dielectric material such as oxide). The second insulation layer includes a number of conductive vias 750 (e.g., the first conductive vias 562 of FIG. 5 or 662 of FIG. 6B) that are distributed on the integrated structure 764. In an example as shown in diagram (d) of FIG. 7, first conductive stripes having the distributed conductive vias 750 are divided into a first group and a second group. The first conductive stripes having the distributed conductive vias 750 in the first group extend along the second direction (e.g., X direction) to be physically connected to a third conductive stripe 765 that extends along the first direction (e.g., Y direction). The first conductive stripes having the distributed conductive vias 750 in the second group extend along the second direction (e.g., X direction) to be physically connected to another third conductive stripe 765 that extends along the first direction (e.g., Y direction). The two third conductive stripes 765 can also include the distributed conductive vias 750.

In some implementations, e.g., as illustrated in diagram (b) of FIG. 6A and diagram (b) of FIG. 7, first conductive vias and second conductive vias in an insulation layer (e.g., the insulation layer 540 of FIG. 5 or 640 of FIGS. 6A-6B) are conductive stripes and arranged opposite to each other to form subordinate capacitors. In some implementations, as illustrated with further details in FIG. 8 below, first conductive vias and second conductive vias in an insulation layer (e.g., the insulation layer 540 of FIG. 5 or 640 of FIGS. 6A-6B) are conductive pillars and arranged in a shape, e.g., stripe or trench, such that multiple first conductive vias and multiple second conductive vias can function as parallel plates to form a subordinate capacitor.

Figure 8:
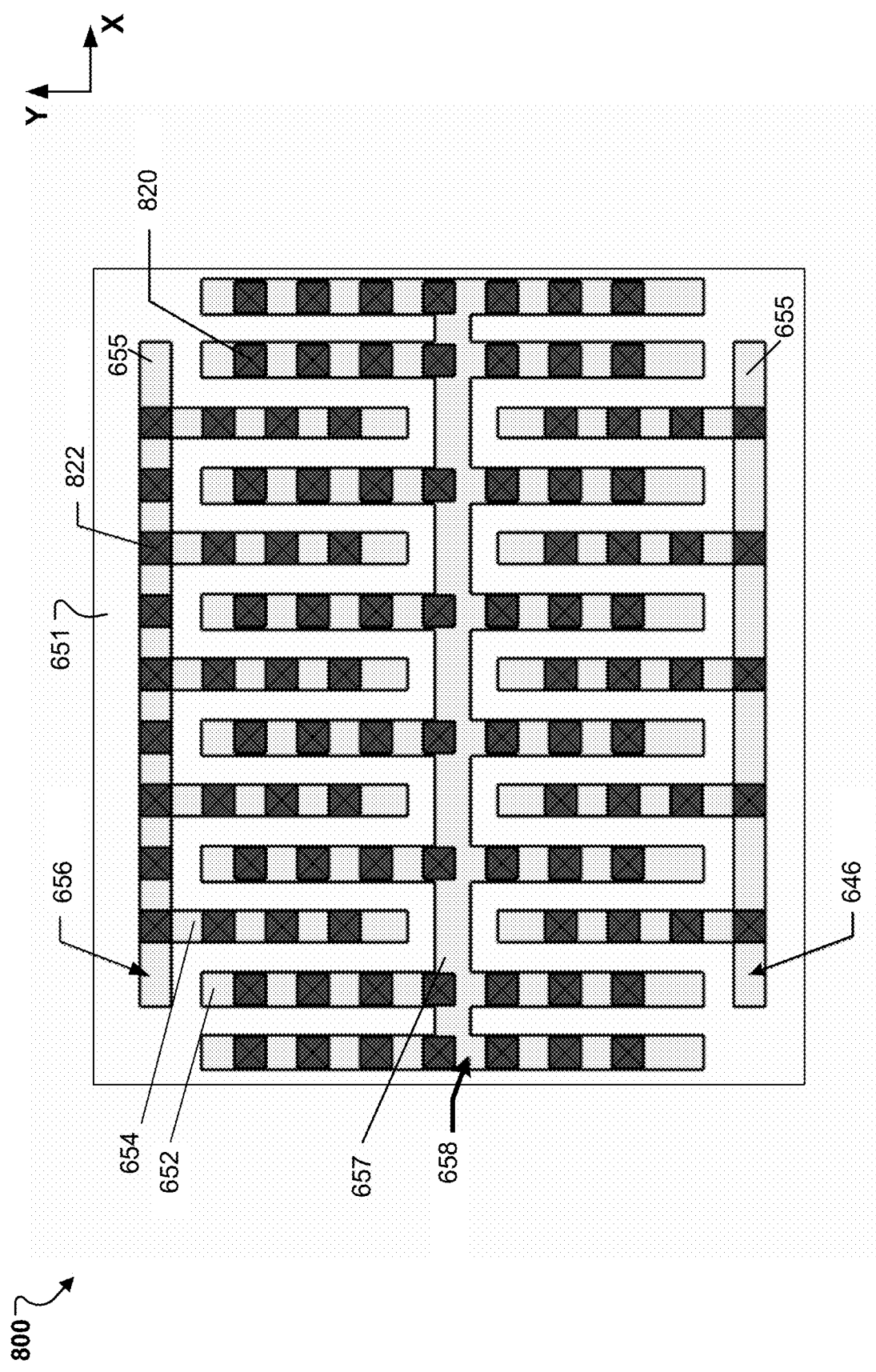
FIG. 8 shows a layout diagram of a further example of multiple stacked layers of an MIM capacitor.

FIG. 8 shows a layout diagram 800 of a further example of multiple stacked layers 640, 650 of the capacitor 620 of FIGS. 6A-6B. The conductive layer 650 in the layout diagram 800 is configured to have a same layout as the layout in diagram (c) of FIG. 6A. Different from the configuration of the insulation layer 640 in diagram (b) of FIG. 6A, the insulation layer 640 shown in the diagram 800 includes individual conductive vias as conductive pillars that are separated from each other by an insulating material, e.g., the insulating material 641 of diagram (b) of FIG. 6A. In some examples, as shown in FIG. 8, one or more first conductive vias 820 are distributed according to a first conductive stripe 642, and one or more second conductive vias 822 are distributed according to a second conductive stripe 644. In such a way, the one or more first conductive vias 820 function as a first conductive plate, and the one or more second conductive vias 822 function as a second conductive plate. Thus, the one or more second conductive vias 822 can form a subordinate capacitor with the one or more first conductive vias 820, which can also increase a capacitance value of the capacitor 620.

Figure 9:
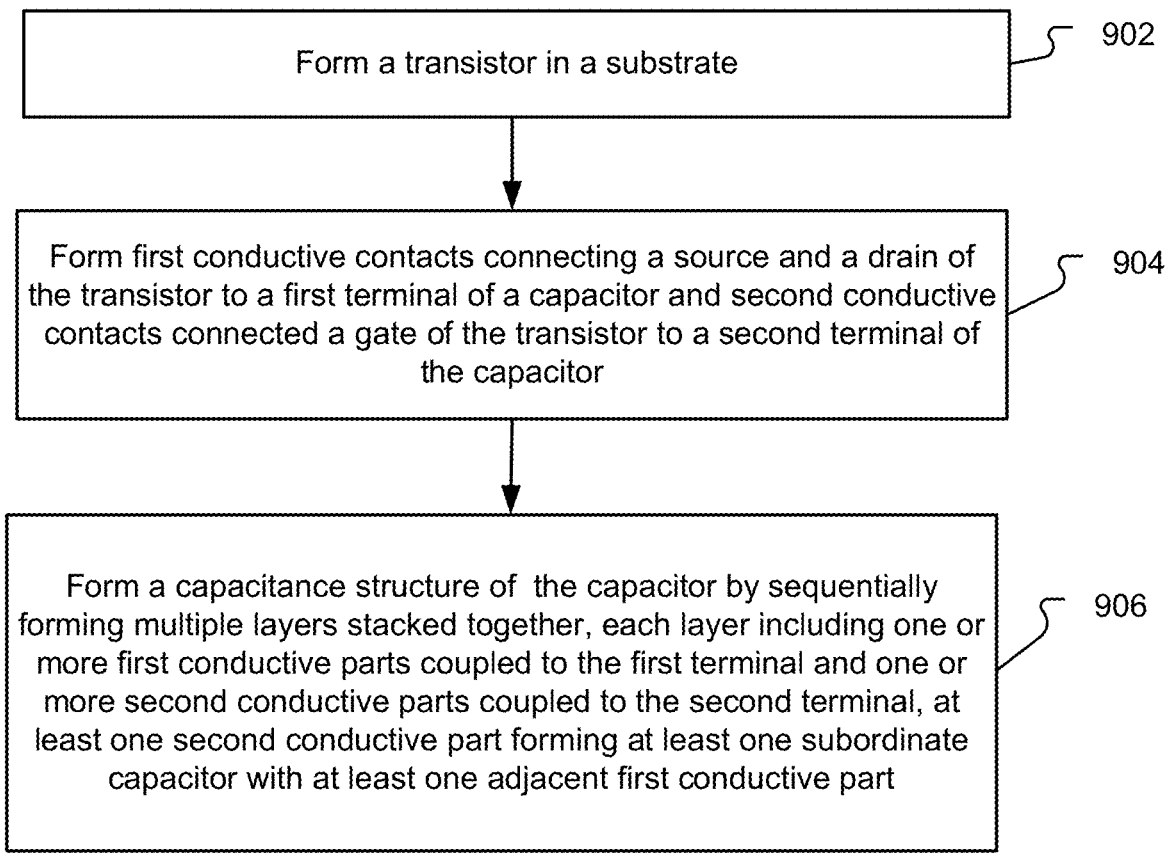
FIG. 9 is a flow chart of an example process for managing capacitors in a memory device.

FIG. 9 illustrates a flow chart of an example process 900 for managing a capacitor of a memory device. The memory device can be implemented as the memory 116 of FIG. 1A, the memory device 200 of FIG. 2, the memory device 400 of FIG. 4A, or the memory device 450 of FIG. 4B. The capacitor can be implemented as the capacitor 320 of FIG. 3, the MIM capacitor 430 of FIG. 4A, the MIM capacitor 470 of FIG. 4C, the capacitor 520 of FIG. 5, or the capacitor 620 of FIGS. 6A-6B. The memory device can include a transistor, e.g., the transistor 440 of FIG. 4A, 470 of FIG. 4B, 510 of FIG. 5 or 610 of FIG. 6B. The process 900 can include a back-end process.

At 902, the transistor is formed on or in a substrate. The substrate can be the substrate 402 of FIG. 4A, 4B, or 4C, 502 of FIG. 5 or 602 of FIG. 6B. The transistor includes a gate (e.g., the gate 442 of FIG. 4A, 482 of FIG. 4C, 504 of FIG. 5, or 612 of FIG. 6B), a source (e.g., 444 of FIG. 4A, 484 of FIG. 4C, 506 of FIG. 5, or 614 of FIG. 6B), and a drain e.g., 446 of FIG. 4A, 486 of FIG. 4C, 508 of FIG. 5, or 616 of FIG. 6B. The source and the drain of the transistor can be formed by two doped regions (e.g., N-type regions) in a well region (e.g., P type well region or N type well region) within the substrate.

At 904, first conductive contacts are formed to connect the source and the drain of the transistor to a first terminal of a capacitor and second conductive contacts are formed to connect the gate of the transistor to a second terminal of the capacitor. The second terminal is formed and insulated from the first terminal. The first terminal can be 431 of FIG. 4A, 471 of FIG. 4C, 524 of FIG. 5, or 624 of FIG. 6B. The second terminal can be the second terminal 433 of FIG. 4A, 473 of FIG. 4C, 526 of FIG. 5, or 626 of FIG. 6B. The second terminal can be a metal plate and can be formed in a circuit layer (e.g., the CuA layer 202 of FIG. 2 or the circuit layer 452 of FIG. 4B). The second terminal can be insulated from the first terminal by an insulating material, e.g., a dielectric material such as oxide.

The first conductive contacts are formed to be conductively coupled to the first terminal and the second conductive contacts are formed to be conductively coupled to the second terminal. The first conductive contacts can be the first conductive contacts 434 of FIG. 4A, 474 of FIG. 4C, 512 of FIG. 5, or 604 of FIG. 6B, and the second conductive contacts can be the second conductive contacts 433 of FIG. 4A, 473 of FIG. 4C, 514 of FIG. 5, or 606 of FIG. 6B.

In some examples, the capacitor can be an MIM capacitor 430 of FIG. 4A. The first conductive contacts and the second conductive contacts can be the first conductive contacts 434 and the second conductive contacts 435 of FIG. 4A that are through-array-contacts (TACs), e.g., the TACs 222 of FIG. 2. The first conductive contacts and the second conductive contacts can be formed after a memory cell array (e.g., 210 of FIG. 2 or 410 of FIG. 4A) is formed and/or a staircase structure (e.g., 220 of FIG. 2 or 420 of FIG. 4A) is formed.

In some examples, the capacitor can be an MIM capacitor 470 of FIG. 4C. The first conductive contacts and the second conductive contacts can be the first conductive contacts 474 and the second conductive contacts 473 of FIG. 4C that are conductive contacts in or on the circuit layer. The first conductive contacts and the second conductive contacts can be formed before the memory cell array is formed and/or the staircase structure is formed.

At 906, a capacitance structure of the capacitor is formed by sequentially forming multiple layers stacked together. Each layer includes one or more first conductive parts conductively coupled to the first terminal and one or more second conductive parts conductively coupled to the second terminal. At least one second conductive part forms at least one subordinate capacitor with at least one adjacent first conductive part.

The capacitance structure can be the capacitance structure 432 of FIG. 4A, 472 of FIG. 4C, 522 of FIG. 5, or 622 of FIGS. 6A-6B. The capacitance structure includes multiple conductive layers, e.g., the conductive layers 530, 550 of FIG. 5 or 630, 650 of FIGS. 6A-6B. Adjacent conductive layers can be insulated by a corresponding insulation layer therebetween, e.g., the insulation layer 540 of FIG. 5 or 640 of FIGS. 6A-6B. First conductive parts in the adjacent conductive layers can be conductively coupled through one or more first conductive vias (e.g., the first conductive vias 542 of FIG. 5, 642 of FIGS. 6A-6B, or 722 of FIG. 7) in the corresponding insulation layer, and second conductive parts in the adjacent conductive layers are conductively coupled through one or more second conductive vias (e.g., the second conductive vias 544 of FIG. 5, 644 of FIGS. 6A-6B, or 724 of FIG. 7) in the corresponding insulation layer. The one or more first conductive vias and the one or more second conductive vias in the corresponding insulation layer are conductively insulated, e.g., by the insulating material 641 of FIG. 6A or 721 of FIG. 7. The corresponding insulation layer is configured such that at least one second conductive via forms at least one additional subordinate capacitor (e.g., the capacitor 543 of FIG. 5 or 643 of FIG. 6B) with at least one adjacent first conductive via in the corresponding insulation layer. In some embodiments, as illustrated in FIG. 5, each of the one or more second conductive vias forms at least one subordinate capacitor with at least one adjacent first conductive via in the corresponding insulation layer.

In some embodiments, as illustrated in FIGS. 6A and 7, a layout of the one or more first conductive vias and the one or more second conductive vias in the corresponding insulation layer is substantially same as a layout of the one or more first conductive parts and the one or more second conductive parts in at least one of the adjacent conductive layers.

In some embodiments, at least one first conductive via or at least one second conductive via in the corresponding insulation layer includes a conductive stripe, e.g., as illustrated in FIGS. 6A and 7. At least one of two or more first conductive vias or two or more second conductive vias in the corresponding insulation layer can be conductively coupled to form one or more trenches. At least one of the one or more first conductive vias or the one or more second conductive vias can form an integrated structure, e.g., 646 of FIG. 6A, or 726, 728 of FIG. 7.

In some embodiments, as illustrated in FIG. 8, at least one of the one or more first conductive vias or the one or more second conductive vias include individual conductive pillars that are insulated from each other. Two or more first conductive vias and two or more second conductive vias can be configured to form a corresponding subordinate capacitor. For example, at least one of the two or more first conductive vias or the two or more second conductive vias can be arranged according to a stripe shape or a trench shape.

In some embodiments, first conductive parts in one of the first and second conductive layers (e.g., 650 in diagram (c) of FIG. 6A) are physically connected together to form a first integrated structure (e.g., 658 in diagram (c) of FIG. 6A), and second conductive parts in the other one of the first and second conductive layers (e.g., 630 in diagram (a) of FIG. 6A) are physically connected together to form a second integrated structure (e.g., 636 in diagram (a) of FIG. 6A). At least one second conductive part is separated from another second conductive part in the one of the first and second conductive layers, e.g., as illustrated in diagram (c) of FIG. 6A, and at least one first conductive part is separated from another first conductive part in the other one of the first and second conductive layers, e.g., as illustrated in diagram (a) of FIG. 6A.

In some embodiments, the capacitance structure further includes a top layer (e.g., the top layer 570 of FIG. 5 or 670 of FIGS. 6A-6B) arranged on the plurality of layers, the top layer including a plurality of first conductive parts (e.g., the first conductive parts 572 of FIG. 5) conductively coupled to the first terminal. At least one second conductive part in an adjacent conductive layer (e.g., the conductive layer 550 of FIG. 5 or 650 of FIGS. 6A-6B) under the top layer can form at least one additional subordinate capacitor (e.g., the subordinate capacitor 563 of FIG. 5 or 663 of FIG. 6B) with the plurality of first conductive parts in the top layer. The capacitance structure can further include an insulation layer (e.g., the insulation layer 560 of FIG. 5 or 660 of FIGS. 6A-6B) between the top layer and the adjacent conductive layer. The insulation layer can include one or more conductive vias (e.g., the first conductive vias 562 of FIG. 5 or 662 of FIG. 6B) configured to conductively couple the plurality of first conductive parts to one or more corresponding first conductive parts in the adjacent conductive layer. As illustrated in FIG. 5, 6A, 6B, or 7, the top layer includes no second conductive part, and the first conductive parts in the top layer are conductively insulated from each other, and the one or more conductive vias in the insulation layer are distributed as individual conductive contacts.

In some embodiments, the capacitor is configured to be a transistor, e.g., an MOS transistor. The transistor has a gate, a source, and a drain. The source and the drain can be two doped regions formed in a substrate (e.g., the doped regions 444, 446 of FIG. 4A, 484, 486 of FIG. 4C, 506, 508 of FIG. 5, or 614, 616 of FIG. 6B). The second terminal can be configured to be coupled to the gate of the transistor through corresponding second conductive contacts, and the first terminal of the capacitor can be configured to be coupled to the source and the drain of the transistor through corresponding first conducive contacts.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A device comprising:
    a first terminal;
    a second terminal conductively insulated from the first terminal;
    a transistor comprising a gate, a source, and a drain; and
    a capacitance structure comprising a plurality of layers sequentially stacked together,
    wherein at least one layer of the plurality of layers comprises:
        one or more first conductive parts and one or more second conductive parts that are conductively insulated, the one or more first conductive parts being conductively coupled to the first terminal, the one or more second conductive parts being conductively coupled to the second terminal,
        wherein the at least one layer is configured such that at least one of the one or more second conductive parts form at least one subordinate capacitor with at least one adjacent first conductive part, and
    wherein the first terminal is conductively coupled to the source and the drain of the transistor through one or more first conductive contacts, and the second terminal is conductively coupled to the gate of the transistor through one or more second conductive contacts.

2. The device of claim 1, wherein the plurality of layers comprises multiple conductive layers,
    wherein adjacent first and second conductive layers are insulated by a corresponding insulation layer therebetween, and
    wherein first conductive parts of the first and second conductive layers are conductively coupled through one or more first conductive vias in the corresponding insulation layer to the first terminal, and second conductive parts of the first and second conductive layers are conductively coupled through one or more second conductive vias in the corresponding insulation layer to the second terminal.

3. The device of claim 2, wherein the one or more first conductive vias and the one or more second conductive vias in the corresponding insulation layer are conductively insulated, and
    wherein the corresponding insulation layer is configured such that at least one second conductive via forms at least one additional subordinate capacitor with at least one adjacent first conductive via in the corresponding insulation layer.

4. The device of claim 3, wherein a layout of the one or more first conductive vias and the one or more second conductive vias in the corresponding insulation layer is substantially same as a layout of one or more first conductive parts and one or more second conductive parts in at least one of the first and second conductive layers.

5. The device of claim 3, wherein at least one first conductive via or at least one second conductive via in the corresponding insulation layer comprises a conductive stripe, and
wherein at least one of two or more first conductive vias or two or more second conductive vias in the corresponding insulation layer are conductively coupled to form one or more trenches.

6. The device of claim 3, wherein at least one of the one or more first conductive vias or the one or more second conductive vias form an integrated structure.

7. The device of claim 2, wherein first conductive parts in one of the first and second conductive layers are physically connected together to form a first integrated structure, and
wherein second conductive parts in the other one of the first and second conductive layers are physically connected together to form a second integrated structure.

8. The device of claim 2, wherein at least one of the one or more first conductive vias or the one or more second conductive vias comprise individual conductive pillars that are insulated from each other, and
wherein two or more first conductive vias and two or more second conductive vias are configured to form a corresponding subordinate capacitor.

9. The device of claim 1, wherein the capacitance structure further comprises a top layer arranged on the plurality of layers, the top layer comprising a plurality of first conductive parts conductively coupled to the first terminal, and
wherein at least one second conductive part in an adjacent conductive layer under the top layer forms at least one additional subordinate capacitor with one or more first conductive parts in the top layer.

10. The device of claim 9, wherein the capacitance structure comprises an insulation layer between the top layer and the adjacent conductive layer, and
wherein the insulation layer comprises one or more conductive vias configured to conductively couple the plurality of first conductive parts in the top layer to one or more corresponding first conductive parts in the adjacent conductive layer.

11. The device of claim 10, wherein the top layer includes no second conductive part, and the first conductive parts in the top layer are conductively insulated from each other, and
wherein the one or more VIAs in the insulation layer are distributed as individual conductive contacts.

12. The device of claim 1, wherein at least one of the one or more first conductive parts or the one or more second conductive parts forms an integrated structure.

13. A device comprising:
an input node configured to receive an input voltage;
an output node configured to output an output voltage; and
a plurality of units conductively coupled in series between the input node and the output node and configured to generate the output voltage based on the input voltage,
wherein each of the units comprises:
a diode; and
a capacitor having a first node coupled between the diode and a sequential unit immediately after the unit and a second node configured to receive a clock signal, the diode being configured to control the capacitor using the clock signal, and
wherein the capacitor comprises:
a first terminal;
a second terminal conductively insulated from the first terminal; and
a capacitance structure comprising a plurality of layers sequentially stacked together,
wherein at least one layer of the plurality of layers comprises:
one or more first conductive parts and one or more second conductive parts that are conductively insulated, the one or more first conductive parts being conductively coupled to the first terminal, the one or more second conductive parts being conductively coupled to the second terminal, wherein the at least one layer is configured such that at least one of the one or more second conductive parts forms at least one subordinate capacitor with at least one adjacent first conductive part in the layer.

14. The device of claim 13, wherein the plurality of layers comprises multiple conductive layers, wherein adjacent conductive layers are insulated by a corresponding insulation layer therebetween, and wherein first conductive parts in the adjacent conductive layers are conductively coupled through one or more first conductive vias in the corresponding insulation layer to the first terminal, and second conductive parts in the adjacent conductive layers are conductively coupled through one or more second conductive vias in the corresponding insulation layer to the second terminal, and
wherein the one or more first conductive vias and the one or more second conductive vias in the corresponding insulation layer are conductively insulated, and wherein the corresponding insulation layer is configured such that at least one second conductive via forms at least one additional subordinate capacitor with at least one adjacent first conductive via in the corresponding insulation layer.

15. A memory device comprising:
a semiconductor substrate;
a memory cell array of memory cells on the semiconductor substrate;
a transistor comprising a gate, a source, and a drain; and
at least one capacitor comprising:
a first terminal;
a second terminal arranged insulated from the first terminal; and
a capacitance structure comprising a plurality of layers sequentially stacked together above the semiconductor substrate,
wherein at least one layer of the plurality of layers comprises: one or more first conductive parts and one or more second conductive parts that are conductively insulated, the one or more first conductive parts being conductively coupled to the first terminal, the one or more second conductive parts being conductively coupled to the second terminal, wherein the at least one layer is configured such that each of the one or more second conductive parts form at least one subordinate capacitor with at least one adjacent first conductive part, and
wherein the first terminal of the at least one capacitor is conductively coupled to the source and the drain through one or more first conductive contacts, and the second terminal of the at least one capacitor is conductively coupled to the gate of the transistor through one or more second conductive contacts.

16. The memory device of claim 15, wherein the plurality of layers comprises multiple conductive layers, wherein adjacent conductive layers are insulated by a corresponding insulation layer therebetween, and wherein first conductive parts in the adjacent conductive layers are conductively coupled through one or more first conductive vias in the corresponding insulation layer to the first terminal, and second conductive parts in the adjacent conductive layers are conductively coupled through one or more second conductive vias in the corresponding insulation layer to the second terminal, and wherein the one or more first conductive vias and the one or more second conductive vias in the corresponding insulation layer are conductively insulated, and wherein the corresponding insulation layer is configured such that at least one second conductive via forms at least one additional subordinate capacitor with at least one adjacent first conductive via in the corresponding insulation layer.

17. The memory device of claim 16, wherein first conductive parts in one of the adjacent conductive layers are physically connected together to form a first integrated structure, and wherein second conductive parts in another one of the adjacent conductive layers are physically connected together to form a second integrated structure.

18. The memory device of claim 15, wherein the transistor is formed on the semiconductor substrate, wherein two doped regions are formed in the semiconductor substrate and configured to be the source and the drain of the transistor, respectively, and wherein the gate of the transistor comprises a metal plate conductively insulated from the two doped regions in the semiconductor substrate.

19. The memory device of claim 15, wherein the at least one capacitor is peripheral to the memory cell array, and wherein the at least one capacitor is arranged above the memory cell array, and the first conductive contacts and the second conductive contacts are through-array contacts.

20. The memory device of claim 15, wherein the at least one capacitor is integrated in a circuit layer under the memory cell array.

* * * * *